(12) United States Patent
Wada

(10) Patent No.: US 11,891,245 B2
(45) Date of Patent: Feb. 6, 2024

(54) TRANSPORT SYSTEM

(71) Applicant: Murata Machinery, Ltd., Kyoto (JP)

(72) Inventor: Eiji Wada, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 119 days.

(21) Appl. No.: 17/425,493

(22) PCT Filed: Dec. 13, 2019

(86) PCT No.: PCT/JP2019/048872
§ 371 (c)(1),
(2) Date: Jul. 23, 2021

(87) PCT Pub. No.: WO2020/153041
PCT Pub. Date: Jul. 30, 2020

(65) Prior Publication Data
US 2022/0081207 A1    Mar. 17, 2022

(30) Foreign Application Priority Data

Jan. 25, 2019   (JP) ................. 2019-011282

(51) Int. Cl.
*B65G 1/04* (2006.01)
(52) U.S. Cl.
CPC ......... *B65G 1/0457* (2013.01); *B65G 1/0464* (2013.01); *B65G 2201/0297* (2013.01)
(58) Field of Classification Search
CPC .. B65G 1/0457; B65G 1/0464; B65G 1/0428; B65G 2201/0297; B65G 17/20;
(Continued)

(56) References Cited

U.S. PATENT DOCUMENTS 10,196,214 B2    2/2019 Motoori
10,734,267 B2    8/2020 Motoori
(Continued)

FOREIGN PATENT DOCUMENTS

JP     2000-124284    4/2000
JP     2017-030944    2/2017
(Continued)

OTHER PUBLICATIONS

Request for the Submission of an Opinion dated Nov. 22, 2022, of counterpart Korean Patent Application No. 10-2021-7023447, along with an English translation.

*Primary Examiner* — Glenn F Myers
(74) *Attorney, Agent, or Firm* — DLA Piper LLP (US)

(57) ABSTRACT

The efficiency of transporting articles is improved by smoothly delivering and receiving the articles between overhead transport vehicles traveling on different tracks. A transport system includes a first overhead transport vehicle that travels on a first overhead track; a second overhead transport vehicle that travels on a second overhead track and a third overhead track; and a first placement portion and a second placement portion that allow articles to be delivered and received between the first overhead transport vehicle and the second overhead transport vehicle. At least one of the first overhead transport vehicle, the second overhead transport vehicle, the first placement portion, and the second placement portion is provided with a rotator that rotates an article around a vertical axis.

6 Claims, 14 Drawing Sheets

(58) Field of Classification Search
CPC ......... H01L 21/67733; H01L 21/67736; H01L 21/67768; H01L 21/67769; H01L 21/67727; B61B 13/04; B61B 3/02; B61K 1/02
See application file for complete search history.

(56) References Cited

U.S. PATENT DOCUMENTS

| | | | |
|---|---|---|---|
| 2007/0163461 A1* | 7/2007 | Shiwaku | H01L 21/67769 104/89 |
| 2013/0199892 A1 | 8/2013 | Ota et al. | |
| 2015/0329298 A1* | 11/2015 | Ito | H01L 21/67733 414/222.07 |
| 2015/0332948 A1* | 11/2015 | Ikeda | H01L 21/67736 700/230 |
| 2016/0276191 A1 | 9/2016 | Kinugawa | |
| 2017/0140966 A1* | 5/2017 | Li | H01L 21/67766 |
| 2017/0278736 A1* | 9/2017 | Iwasaki | H01L 21/67736 |
| 2018/0105361 A1 | 4/2018 | Horii et al. | |

FOREIGN PATENT DOCUMENTS

| | | |
|---|---|---|
| KR | 10-2016-0111329 A | 9/2016 |
| KR | 10-2018-0043171 A | 4/2018 |
| WO | 2012/060291 | 5/2012 |
| WO | 2015/174181 | 11/2015 |
| WO | 2017/029871 | 2/2017 |
| WO | 2017/029873 | 2/2017 |

* cited by examiner

TRANSPORT SYSTEM

TECHNICAL FIELD

This disclosure relates to a transport system.

BACKGROUND ART

In a semiconductor manufacturing plant, for example, articles such as a front-opening unified pod (FOUP) that accommodates semiconductor wafers or reticle pods that accommodate reticles are transported by overhead transport vehicles, and the articles are delivered to or received from a transfer destination such as a load port of a processing apparatus. As such a transport system, for example, a configuration is known in which two overhead tracks are arranged parallel in the vertical direction at a ceiling and articles are delivered or received between overhead transport vehicles traveling on the respective overhead tracks (see International Publication No. WO 2017/029871, for example). That transport system is provided with a placement portion onto or from which each of an overhead transport vehicle traveling on the upper overhead track and an overhead transport vehicle traveling on the lower overhead track can deliver or receive an article, and the article is delivered or received via this placement portion.

In the transport system described in International Publication No. WO 2017/029871, a configuration is described in which the traveling direction of the upper overhead transport vehicles and the traveling direction of the lower overhead transport vehicles are the same. However, an instance is also assumed in which the traveling direction of an upper overhead transport vehicle and the traveling direction of a lower overhead transport vehicle are different. The front-and-rear orientation of each article to be transported by overhead transport vehicles may be defined. In that instance, for example, when an article that has been placed on the placement portion by an upper overhead transport vehicle is received by a lower overhead transport vehicle, the lower overhead transport vehicle may be unable to immediately place the article onto a transport destination because the front-and-rear orientation of the article are changed. Thus, a placement portion that enables delivery and reception between the upper overhead transport vehicle and the overhead transport vehicle may be limited, whereby the efficiency of transporting articles may decrease.

It could therefore be helpful to provide a transport system that enables improvement of the efficiency of transporting articles by smoothly delivering and receiving the articles between overhead transport vehicles traveling on different tracks.

SUMMARY

I thus provide:

A transport system that transports an article a front-and-rear orientation of which is defined, and may include: a first overhead track a traveling direction of which is set to be a first direction; a first overhead transport vehicle including a first traveler that travels along the first overhead track, a first holder that holds the article, and a first lifting driver that raises and lowers the first holder; a second overhead track a traveling direction of which is set to be a second direction; a third overhead track that is provided parallel to the second overhead track and a traveling direction of which is set to be a third direction opposite to the second direction; a second overhead transport vehicle including a second traveler that travels on the second overhead track and the third overhead track, a second holder that holds the article, a second lifting driver that raises and lowers the second holder, and a second lateral feeder that laterally moves the second lifting driver; a first placement portion onto which or from which the second overhead transport vehicle on the second overhead track delivers or receives the article; and a second placement portion onto which or from which the second overhead transport vehicle on the third overhead track delivers or receives the article. The first overhead transport vehicle is able to deliver or receive the article onto or from the first placement portion with the first lifting driver being positioned directly above the first placement portion, and is able to deliver or receive the article onto or from the second placement portion with the first lifting driver being positioned directly above the second placement portion, and at least one of the first overhead transport vehicle, the second overhead transport vehicle, the first placement portion, and the second placement portion is provided with a rotator that rotates the article around a vertical axis.

The transport system may include: a rack including a plurality of storages arranged vertically; and a crane that travels along a track including the first overhead track and delivers and receives the article between the storages. The first overhead transport vehicle may include a first lateral feeder that laterally moves the first lifting driver, and may be able to deliver or receive the article to or from each storage with the first lifting driver being laterally fed directly above the storage by the first lateral feeder. The second overhead track and the third overhead track may be provided below lower ends of the crane and the rack. At least one of the first placement portion and the second placement portion may be provided in plurality. The rotator may be provided to the first overhead transport vehicle, and may rotate the article held by the first holder around a vertical axis. The rotator may be provided to at least one of the first placement portion and the second placement portion, and may rotate a placed article around the vertical axis. The first direction may be a direction that is the same as the second direction in planar view, and the rotator may rotate the article 180° around the vertical axis. The first direction may be a direction that is orthogonal to the second direction in planar view, and the rotator may rotate the article 90° around the vertical axis.

With the above-described transport system, by the rotator provided to at least one of the first overhead transport vehicle, the second overhead transport vehicle, the first placement portion, and the second placement portion, the article can be rotated around the vertical axis. Thus, with the front-and-rear orientation of an article delivered by the first overhead transport vehicle being specified, the article can be transported by the second overhead transport vehicle. Even when the first overhead track on which the first overhead transport vehicle travels is different in orientation from the second overhead track and the third overhead track on which the second overhead transport vehicle travels, the article can be delivered or received via the article placement portion, whereby the efficiency of transporting articles can be improved.

In the configuration in which the transport system includes the rack including the storages arranged vertically and the crane that travels along the track including the first overhead track and delivers and receives the article between the storages, the first overhead transport vehicle includes the first lateral feeder that laterally moves the first lifting driver and can deliver or receive the article to or from each storage with the first lifting driver being laterally fed directly above the storage by the first lateral feeder, and the second overhead track and the third overhead track are provided below lower ends of the crane and the rack, articles can be efficiently delivered and received between the first overhead transport vehicle and the second overhead transport vehicle while many articles can be stored by the rack. In the configuration in which at least one of the first placement portion and the second placement portion is provided in plurality, more articles are delivered and received between the first overhead transport vehicle and the second overhead transport vehicle, and thus articles can be efficiently delivered and received. In the configuration in which the rotator is provided to the first overhead transport vehicle and rotates the article held by the first holder around the vertical axis, the number of devices each including the rotator can be smaller than when each of the first placement portion and the second placement portion includes the rotator, and thus the manufacturing cost of the transport system can be reduced. In the configuration in which the rotator is provided to at least one of the first placement portion and the second placement portion and rotates the placed article around the vertical axis, the rotator does not have to be provided to the first overhead transport vehicle or the second overhead transport vehicle, and thus the first overhead transport vehicle or the second overhead transport vehicle can be prevented from upsizing. In the configuration in which the first direction is a direction that is the same as the second direction in planar view and the rotator rotates the article 180° around the vertical axis, the front-and-rear orientation of the article can be easily set to an appropriate orientation by rotating the article placed on the first placement portion or the second placement portion 180° around the vertical axis. In the configuration in which the first direction is a direction that is orthogonal to the second direction in planar view and the rotator rotates the article 90° around the vertical axis, the front-and-rear orientation of the article can be easily set by rotating the article placed on the first placement portion or the second placement portion 90° around the vertical axis.

Figure 1:
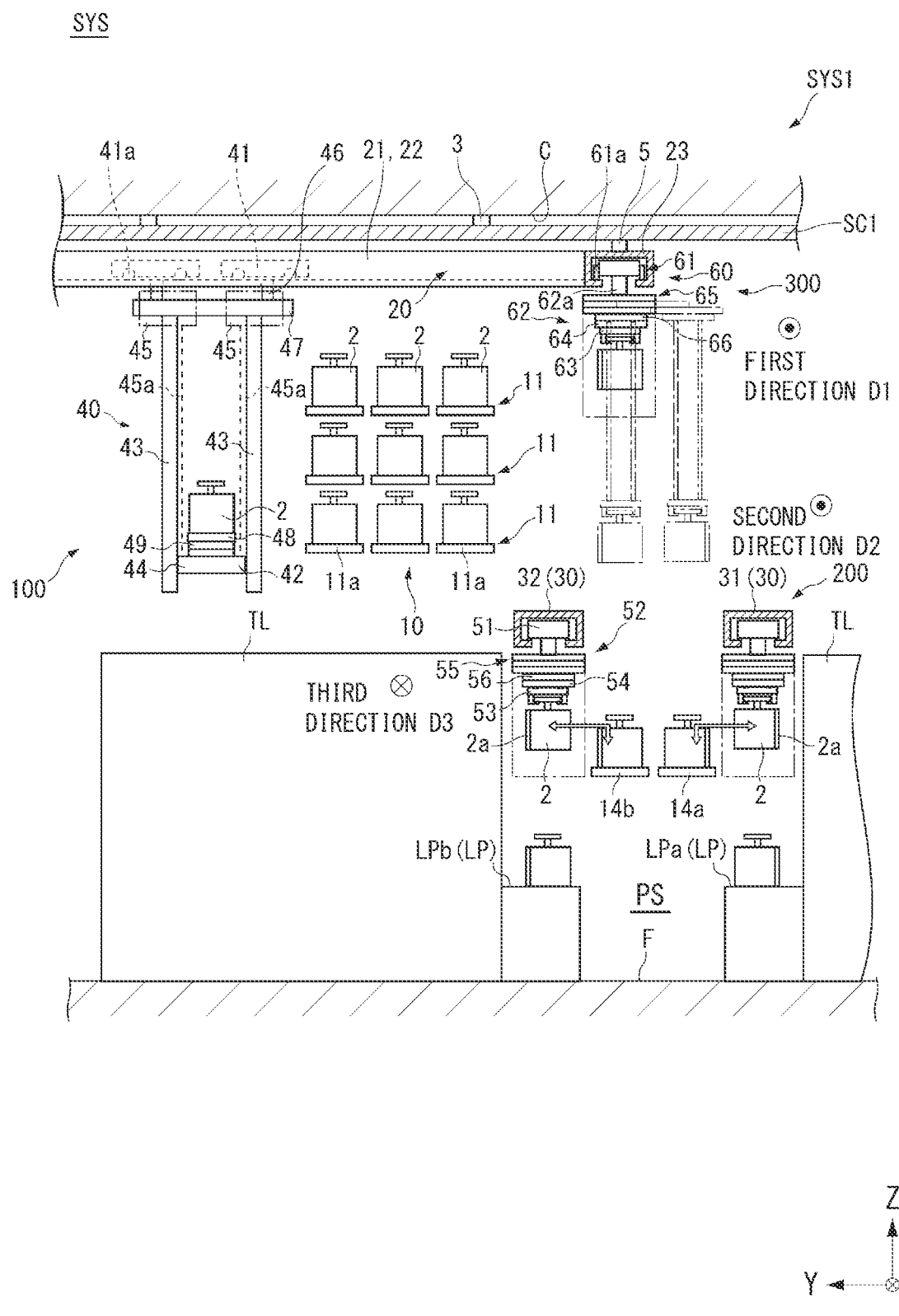
FIG. 1 is a diagram of a transport system according to a first example when viewed from the X direction.

| Description of Reference Signs | |
|---|---|
| C | ceiling |
| F | floor |
| AX1, AX2 | rotation axis |
| LP, LPa, LPb | load port |
| TL | processing apparatus |
| SYS1, SYS2 | transport system |
| 2 | article |
| 2a | lid |
| 10 | rack |
| 11 | storage |
| 14a, 14a1, 14a2, 14a3 | first placement portion |
| 14b, 14b1, 14b2, 14b3 | second placement portion |
| 15, 56, 66 | rotator |
| 20, 25 | upper overhead track (track) |
| 23, 26, 27 | first overhead track |
| 31 | second overhead track |
| 32 | third overhead track |
| 40 | crane |
| 42 | transfer device |
| 45 | lifting driver |
| 50 | second overhead transport vehicle |
| 51 | second traveler |
| 53 | second holder |
| 54 | second lifting driver |
| 55 | second lateral feeder |
| 60 | first overhead transport vehicle |
| 61 | first traveler |
| 63 | first holder |
| 64 | first lifting driver |
| 65 | first lateral feeder |
| 100 | overhead stocker |
| 200 | overhead transport vehicle system |
| 300 | transport device |

DETAILED DESCRIPTION

Examples will now be described with reference to the drawings. This disclosure is not limited to the examples described below. In the drawings, to describe the examples, the scale is changed to be expressed appropriately by, for example, illustrating a part in an enlarged or emphasized manner. In each drawing, directions in the drawing are illustrated with the XYZ-coordinate system. In this XYZ-coordinate system, the vertical direction is defined as the Z direction, horizontal directions are defined with the X direction and the Y direction. The X direction is one direction in the horizontal directions. The Y direction is a direction orthogonal to the X direction. In each direction of the X, Y, and Z directions, the orientation indicated by each arrow is expressed as a positive direction (e.g., +X direction), and the direction opposite to the orientation is expressed as a negative direction (e.g., −X direction).

First Example

Figure 2:
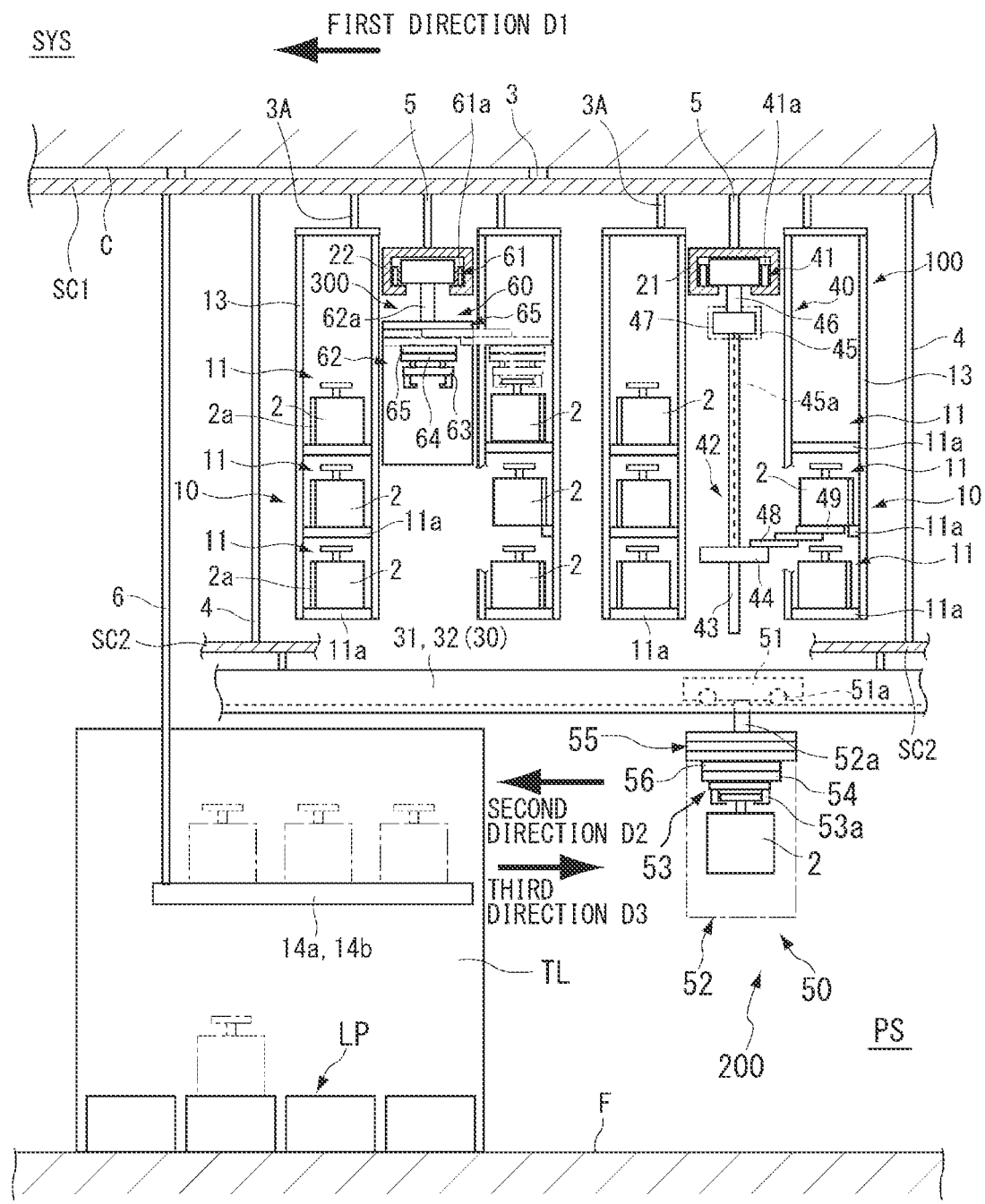
FIG. 2 is a diagram of the transport system illustrated in FIG. 1 when viewed from the Y direction.
Figure 3:
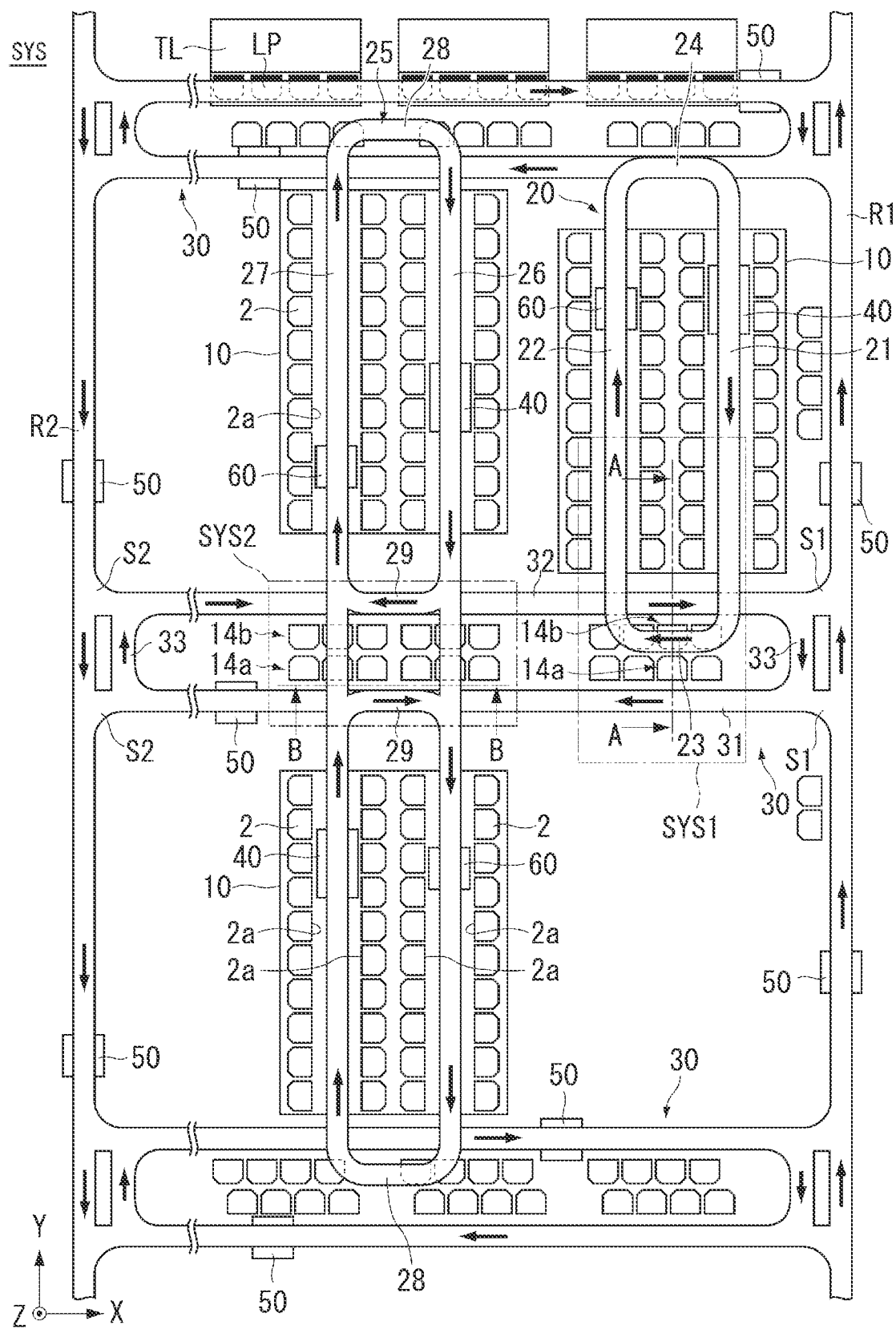
FIG. 3 is a diagram schematically illustrating the transport system illustrated in FIG. 1 in planar view.

FIG. 1 is a diagram of a transport system SYS1 according to a first example when viewed from the X direction. FIG. 2 is a diagram of the example of the transport system SYS1 illustrated in FIG. 1 when viewed from the Y direction. FIG. 3 is a diagram schematically illustrating the transport system SYS1 illustrated in FIG. 1 in planar view. FIG. 1 is a view taken along arrows A-A in FIG. 3. In FIG. 3, to easily recognize the diagram, load ports LP of processing apparatuses TL are shaded in black.

The transport system SYS1 is included in a storing system SYS. The storing system SYS is provided in, for example, a plant of manufacturing semiconductor devices or the like, and store therein articles 2 such as a FOUP that accommodates semiconductor wafers to be used for manufacturing semiconductor devices or a reticle pod that accommodates reticles. An example will be described in which each article 2 is a FOUP. However, the article 2 may be an article other than the FOUP. The storing system SYS is applicable to facilities other than the field of semiconductor manufacturing, and the article 2 may be another article that can be stored in the storing system SYS. The article 2 has a lid 2a. A surface of the article 2 on which the lid 2a is provided is a front face. In other words, the front-and-rear orientation of the article 2 is defined by the lid 2a.

As illustrated in FIGS. 1 to 3, the transport system SYS1 includes elements in an overhead stocker 100, an overhead transport vehicle system 200, and a transport device 300. The overhead stocker 100 includes racks 10 each including a plurality of storages 11, an upper overhead track 20, and a crane 40. The racks 10 are disposed, in planar view, along the upper overhead track 20 on which the crane 40 travels (see FIG. 3). The storages 11 included in each rack 10 are provided to a frame 13 as illustrated in FIG. 2, and are disposed in three stages in the vertical direction (Z direction). The number of the stages of the storages 11 may be optionally set. The storages 11 are disposed in plurality in a manner aligned along a traveling direction (Y direction) of the crane 40 described later.

Each storage 11 includes a shelf 11a on which an article 2 is to be placed. The respective shelves 11a are held by the corresponding frame 13. In the following description, to place an article 2 on a storage 11 means to place the article 2 on the shelf 11a of the storage 11. On the shelf 11a of each storage 11, a plurality of pins that are to be inserted into grooves formed on a bottom face of each article 2 when the article 2 is placed thereon may be formed. When these pins are inserted into the grooves of the article 2, the article 2 is positioned on the storage 11.

Each rack 10 is suspended by the corresponding frame 13 from a system ceiling SC1 with a hanging fitting 3A. The system ceiling SC1 is suspended from a ceiling C of a building by hanging fittings 3. The frame 13 may be suspended directly from the ceiling C instead of being suspended from the system ceiling SC1 with the hanging fitting 3A. The lower end of the rack 10 is set higher than the height of upper ends of the processing apparatuses TL from a floor F. The processing apparatuses TL perform various types of treatments such as deposition treatment or etching treatment on semiconductor wafers accommodated in a FOUP that is an article 2. The height of the lower end of the crane 40 described later is set higher than the height of the upper ends of the processing apparatuses TL. In other words, the overhead stocker 100 is disposed above the upper ends of the processing apparatuses TL. The lower end of the crane 40 is set at a height for an operator, for example, to be able to walk on the floor F without inconvenience. Consequently, a part of a space below the overhead stocker 100 can be used as an operator passage PS.

The crane 40 places articles 2 into the storages 11, and retrieves the articles 2 from the storages 11. A first overhead transport vehicle 60 described later places articles 2 into some of the storages 11, and retrieves the articles 2 from the storages 11. Storages 11 into which articles 2 are delivered by the first overhead transport vehicle 60 are uppermost storages 11 of each rack 10. The vertical dimension of each storage 11 (the dimension from the upper face of the shelf 11a to the lower face of the shelf 11a of the next upper storage 11) is set to a dimension necessary for a transfer device 42 of the crane 40 described later to raise an article 2 while supporting it from below. The transfer device 42 of the crane 40 uses a configuration of raising an article 2 while supporting it from below, for example, and thus does not need a large space above the article 2. For example, the vertical dimension of the storage 11 can be set to a dimension to the extent of adding several centimeters to the vertical dimension of an article 2.

The upper overhead track 20 is suspended from the system ceiling SC1 by hanging fittings 5 as illustrated in FIGS. 1 and 2. The upper overhead track 20 may be suspended directly from the ceiling C instead of being suspended from the system ceiling SC1 by the hanging fittings 5. As illustrated in FIG. 3, the upper overhead track 20 is a circular circuit track having straight sections 21 and 22 extending in the Y direction, a first overhead track 23 connecting between the straight sections 21 and 22 on the −Y side of the straight sections 21 and 22, and a connecting section 24 connecting between the straight sections 21 and 22 on the +Y side of the straight sections 21 and 22. In the first overhead track 23 of the upper overhead track 20, the traveling direction of the first overhead transport vehicle 60 is set to a first direction D1 (−X direction). As illustrated in FIGS. 1 and 2, the height of the upper overhead track 20 from the floor F is higher than a lower overhead track 30 of the overhead transport vehicle system 200.

The above-described racks 10 are provided on the +X side and the −X side with respect to the straight sections 21, 22. In other words, the racks 10 are disposed, in planar view, inside and outside the upper overhead track 20 that is a circuit track on which the crane 40 travels. As described above, the lower ends of racks 10 are set higher than the height of the upper ends of the processing apparatuses TL. Thus, the racks 10 can be disposed above the processing apparatuses TL. A space above the processing apparatuses TL is a space that has been conventionally considered to be a dead space, and by disposing the racks 10 in such a space, the space inside the building can be effectively used.

The crane 40 holds an article 2, and travels to move on the upper overhead track 20. The crane 40 transports an article 2 between a storage 11 and another storage 11. The crane 40 travels on the upper overhead track 20 in a circling manner. The number of cranes 40 disposed on one upper overhead track 20 is not limited to one. For example, two or more cranes 40 may be disposed on one upper overhead track 20. The crane 40 is suspended from the upper overhead track 20 as illustrated in FIGS. 1 and 2.

The crane 40 includes two travelers 41 and a transfer device 42. Below the travelers 41, an upper support 47 is attached with attachments 46, and the two travelers 41 are coupled by the upper support 47. Each traveler 41 includes a traveling driver (not illustrated) and a plurality of wheels 41a, and travels along the upper overhead track 20. The traveling driver (not illustrated) included in the traveler 41 may be, for example, an electric motor provided to the traveler 41 to drive the wheels 41a, or may be a linear motor. The crane 40 includes the two travelers 41, thereby being able to reliably support the transfer device 42 that is a heavy component and an article 2. The crane 40 does not necessarily have to include two travelers 41, and may include one or three or more travelers 41.

The transfer device 42 includes masts 43, a lifting platform 44, lifting drivers 45, a stretcher 48, and a placement platform 49. The masts 43 are suspended from the upper support 47 and extend in the vertical direction. The masts 43 are provided each on the front and the back of the traveler 41 in the traveling direction. The number of the masts 43 is not limited to two in total, and may be one. The masts 43 are provided such that the height of lower ends of the masts 43 from the floor F is higher than the height of the processing apparatuses TL as described above. For example, the lower ends of the masts 43 correspond to the lower end of the crane 40.

The stretcher 48 is configured with a plurality of arms that can stretch and contract in a direction orthogonal to the traveling direction of the traveler 41. The placement platform 49 is provided to a distal end of the stretcher 48. The placement platform 49 is a triangular plate-like member on which an article 2 can be placed. The placement platform 49 holds an article 2 placed on the placement platform 49 by supporting it from below. On the upper face of the placement platform 49, a pin is provided that is inserted into a groove formed on the bottom face of the article 2 to position the article 2. In the shelf 11a of each storage 11 described above, a notch (not illustrated) through which the placement platform 49 can pass in the vertical direction is formed.

When receiving an article 2 from the storage 11, the transfer device 42 stretches the stretcher 48, positions the placement platform 49 below the article 2, and raises the lifting platform 44, thereby picking up the article 2 with the placement platform 49. The transfer device 42 contracts the stretcher 48 with the article 2 being placed on the placement platform 49, thereby disposing the placement platform 49 on which the article 2 is placed above the lifting platform 44. When delivering the article 2 to the storage 11, the transfer device 42 performs the above-described operations in the reverse order. The configuration of the transfer device 42 is not limited to that described above, and another configuration may be used, such as a configuration of raising the article 2 while holding a part (e.g., a flange formed on the top of a FOUP, etc.) thereof.

Two lifting drivers 45 are hoists, for example, that raise and lower the lifting platform 44 along the masts 43. Each lifting driver 45 includes a suspending member 45a and a driver (not illustrated). The suspending members 45a are belts or wires, for example, and the lifting platform 44 is suspended from the upper support 47 by the suspending members 45a. The drivers (not illustrated) included in the lifting drivers 45 are provided in the upper support 47, for example, and pay out and wind the suspending members 45a. When the drivers (not illustrated) included in the lifting drivers 45 pay out the suspending members 45a, the lifting platform 44 descends while being guided by the masts 43. When the drivers (not illustrated) included in the lifting drivers 45 wind the suspending members 45a, the lifting platform 44 ascends while being guided by the masts 43. The lifting drivers 45 are controlled by a controller (not illustrated), for example, to lower or raise the lifting platform 44 at a predetermined speed. The lifting driver 45 is controlled by the controller (not illustrated), for example, to keep the lifting platform 44 at a target height.

The lifting drivers 45 are provided to the upper support 47. The lifting drivers 45 may be provided to the lifting platform 44, for example, instead of being provided to the upper support 47. As a configuration in which the lifting drivers 45 are provided to the lifting platform 44, a configuration may be used in which, for example, belts or wires suspended from the upper support 47 are wound or paid out by hoists or the like mounted on the lifting platform 44 to raise or lower the lifting platform 44. Alternatively, a configuration may be used in which an electric motor, for example, that drives pinion gears is mounted on the lifting platform 44, racks meshing with these pinion gears are formed on the masts 43, and the pinion gears are rotated by the electric motor, for example, to raise and lower the lifting platform 44.

Figure 4:
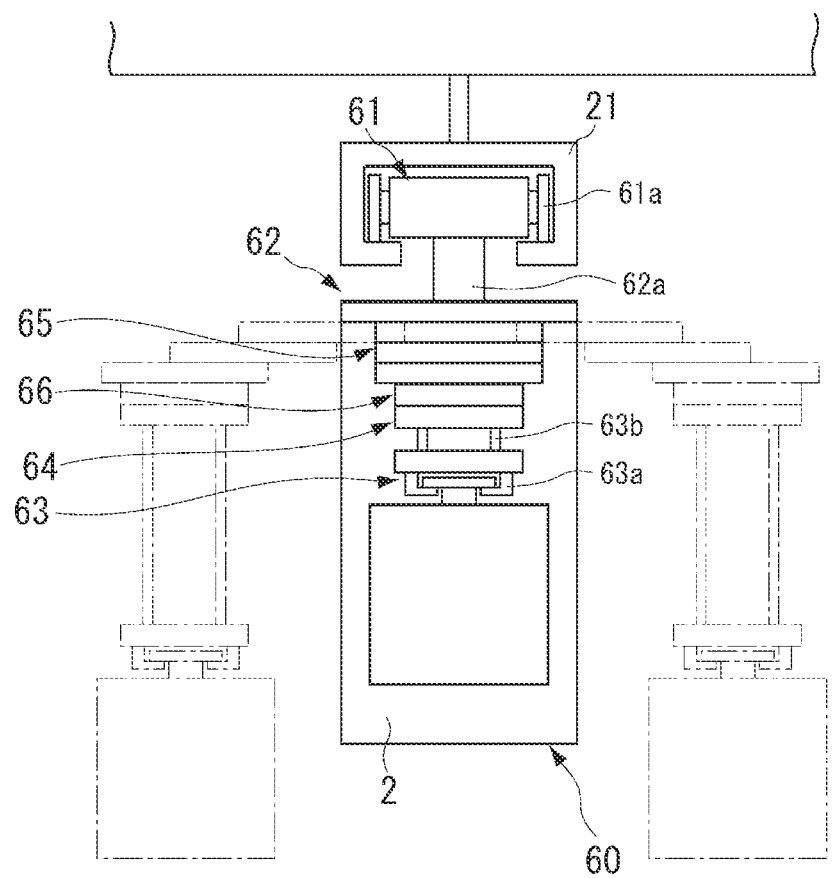
FIG. 4 is a diagram illustrating one example of a first overhead transport vehicle.
Figure 4:
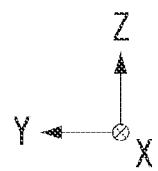

The transport device 300 transports articles 2 between the overhead stocker 100 and the overhead transport vehicle system 200 described later in the vertical direction. The transport device 300 is the first overhead transport vehicle 60. FIG. 4 is diagram illustrating one example of the first overhead transport vehicle 60. As illustrated in FIG. 4, the first overhead transport vehicle 60 includes a first traveler 61 and a first body 62. The first traveler 61 has a configuration similar to that of the traveler 41 of the crane 40, and includes a traveling driver (not illustrated) and a plurality of wheels 61a to travel along the upper overhead track 20. The traveling driver (not illustrated) included in the first traveler 61 may be, for example, an electric motor provided to the first traveler 61 to drive the wheels 61a, or may be a linear motor. The first overhead transport vehicle 60 travels on the upper overhead track 20, and thus there is no need to provide an additional track, and the manufacturing cost of the storing system SYS can be reduced.

The first body 62 is attached to the bottom of the first traveler 61 with an attachment 62a. The first body 62 includes a first holder 63 that holds an article 2, a first lifting driver 64 that raises and lowers the first holder 63 while suspending it, and a first lateral feeder 65 that moves the first lifting driver 64 sideward the track. The first holder 63 grasps a flange of the article 2 from above, thereby suspends and holds the article 2. The first holder 63 is, for example, a chuck including a plurality of claws 63a that can proceed and retreat in the horizontal direction. When the claws 63a are proceeded to below the flange of the article 2 and the first holder 63 is raised, the article 2 is suspended and held. The first holder 63 is connected to suspending members 63b such as wires or belts. The first holder 63 is suspended from the first lifting driver 64 with the suspending members 63b, and is raised and lowered by the first lifting driver 64.

The first lifting driver 64 is a hoist, for example, that lowers the first holder 63 by paying out the suspending members 63b, and raises the first holder 63 by winding the suspending members 63b. The first lifting driver 64 is controlled by a controller (not illustrated), for example, and lowers or raises the first holder 63 at a predetermined speed. The first lifting driver 64 is controlled by the controller (not illustrated), for example, to keep the first holder 63 at a target height.

The first lateral feeder 65 includes movable plates that are arranged in a manner stacked in the vertical direction, for example. The movable plates can move sideward the first traveler 61 with respect to the traveling direction thereof (move in a direction orthogonal to the traveling direction, in the lateral direction). To the movable plates, the first lifting driver 64 is attached. The first body 62 includes a guide (not illustrated) that guides the first lateral feeder 65 and a driver (not illustrated) that drives the first lateral feeder 65. The first lateral feeder 65 uses a driving force from the driver such as an electric motor to move the first lifting driver 64 and the first holder 63 along the guide between a protruding position and a retracted position. The protruding position is a position where the first holder 63 protrudes sideward from the first body 62. The retracted position is a position where the first holder 63 is retracted in the first body 62. Between the first lateral feeder 65 and the first lifting driver 64, a rotator 66 to rotate the first lifting driver 64 around a vertical axis with respect to the first lateral feeder 65 is provided. A configuration may be used in which the rotator 66 is provided between the first lifting driver 64 and the first holder 63 and rotates the first holder 63 around the vertical axis with respect to the first lifting driver 64.

Figure 5A:
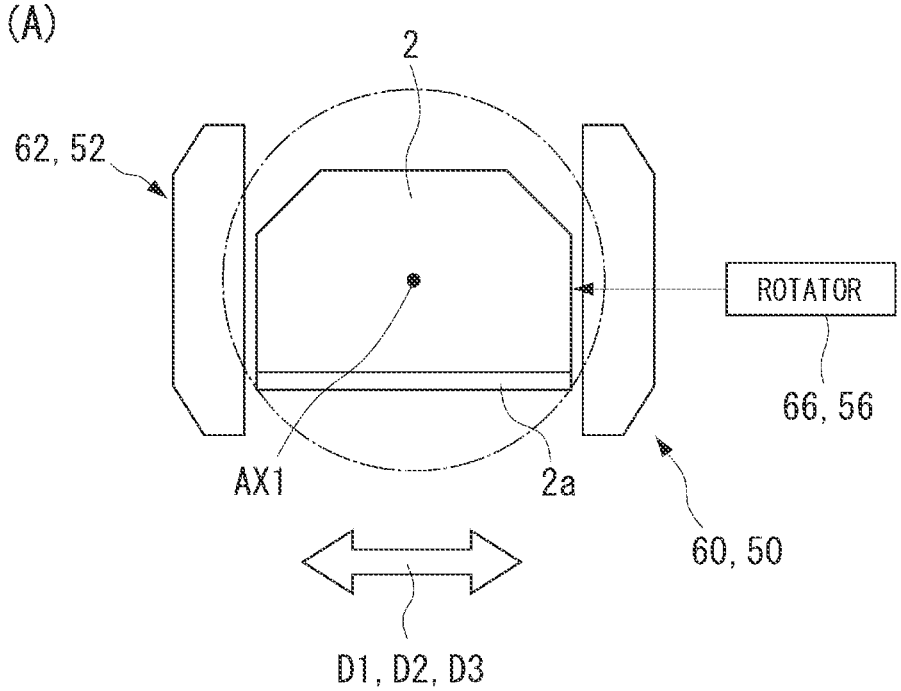
FIGS. 5(A) and 5(B) are plan views illustrating one example of rotating an article in a first overhead transport vehicle or a second overhead transport vehicle.
Figure 5B:
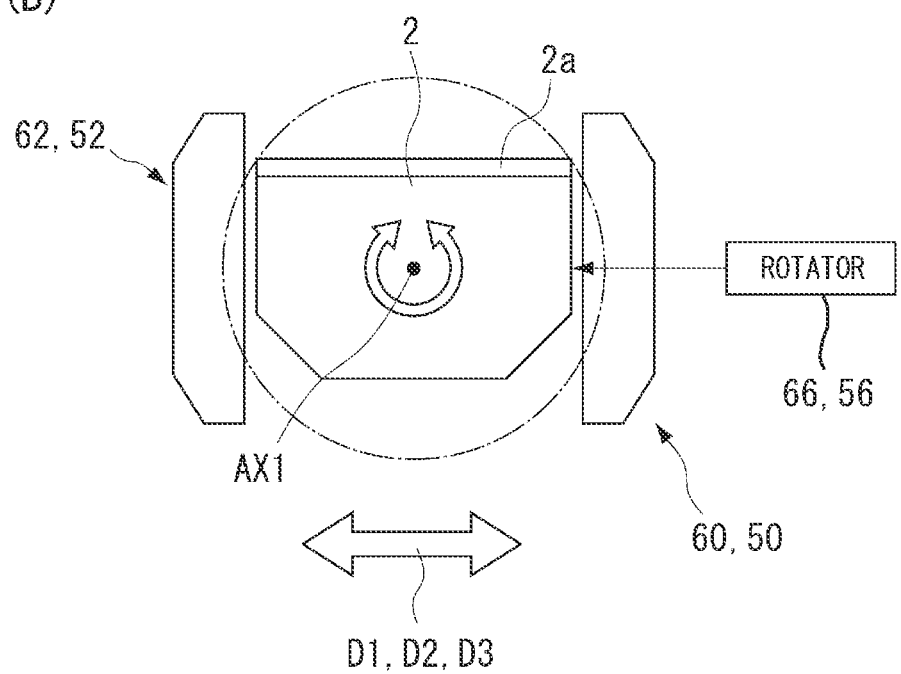

FIGS. 5(A) and 5(B) are plan views illustrating one example of rotating an article on the first overhead transport vehicle 60 or a second overhead transport vehicle 50 described later. As illustrated in FIGS. 5(A) and 5(B), the rotators 66, 56 rotate the first lifting driver 64 or a second lifting driver 54 around the rotation axis AX1 that is a vertical axis. The rotators 66, 56 each include a driving source (not illustrated) such as an electric motor, and cause this driving source to rotate the first lifting driver 64 or the second lifting driver 54. The rotators 66, 56 can rotate the first lifting driver 64 or the second lifting driver 54 180° under the control of a controller (not illustrated), for example. When the rotators 66, 56 rotate the first lifting driver 64 or the second lifting driver 54 180° around the rotation axis AX1, the orientation of a lid 2a of an article 2 grasped by the first holder 63 or a second holder 53 is oppositely oriented in a direction orthogonal to the traveling direction.

With the first lifting driver 64 (first holder 63) being moved to above at least one storage 11 among the storages 11 by the first lateral feeder 65, the first overhead transport vehicle 60 causes the first lifting driver 64 to raise or lower the first holder 63 (article 2), thereby being able to deliver or receive the article 2 to or from a storage 11 located below the first lifting driver 64. The first overhead transport vehicle 60 can deliver and receive an article 2 to and from an uppermost storage 11 of the racks 10. The storage 11 to and from which delivery and reception are to be performed by the first overhead transport vehicle 60 may be a storage 11 other than the uppermost one.

The overhead transport vehicle system 200 includes second overhead transport vehicles 50 that travel along the lower overhead track 30, and deliver and receive articles 2 to and from the load ports LP of the processing apparatuses TL as predetermined destinations disposed below the lower overhead track 30. As illustrated in FIGS. 1 and 2, each second overhead transport vehicle 50 includes a second traveler 51 and a second body 52. The second body 52 includes the second holder 53 that holds an article 2, the second lifting driver 54 that raises and lowers the article 2, a second lateral feeder 55 that moves the second lifting driver 54 laterally with respect to the second traveler 51, and the rotator 56 that rotates the second lifting driver 54 or the second holder 53 around the vertical axis. For the second traveler 51, the second body 52, the second holder 53, the second lifting driver 54, the second lateral feeder 55, and the rotator 56, configurations that are the same as those of the first traveler 61, the first body 62, the first holder 63, the first lifting driver 64, the first lateral feeder 65, and the rotator 66 of the first overhead transport vehicle 60 described above are used. Thus, the second overhead transport vehicle 50 of the overhead transport vehicle system 200 can be used as the first overhead transport vehicle 60 without modification.

The second overhead transport vehicle 50 causes the second lifting driver 54 to raise or lower the second holder 53 (article 2), thereby being able to deliver or receive the article 2 to or from a load port LP. The load ports LP are disposed, for example, in a manner opposed to each other in the Y direction as illustrated in FIG. 1. In the following description, a load port LP disposed on the −Y side is also denoted as a load port LPa, and a load port LP disposed on the +Y side is also denoted as a load port LPb so as to be distinguished from each other. The lower overhead track 30 is attached below the system ceiling SC2 as illustrated in FIG. 2. The system ceiling SC2 is suspended from the system ceiling SC1 by hanging fittings 4. The lower overhead track 30 may be suspended from the system ceiling SC1, or may be suspended directly from the ceiling C instead of being suspended from the system ceiling SC2.

The lower overhead track 30 is disposed between an inter-bay route (inter-bay track) R1 and an inter-bay route R2 in planar view. The lower overhead track 30 is provided in each bay (in each intra-bay), and the inter-bay route R1 and the like are provided to connect a plurality of the lower overhead tracks 30. The bay (intra-bay) indicates a range (area) in which, in planar view, the load ports LP of the processing apparatuses TL are provided in a manner opposed to each other and an operator passage PS is provided between the load ports LP provided in a manner opposed to each other. Each lower overhead track 30 is connected to the inter-bay route R1 via two branch lines S1 for entry or departure, and is connected to the inter-bay route R2 via two branch lines S2 for entry or departure.

The lower overhead track 30 is disposed below the crane 40 (masts 43) that is a lower end of the overhead stocker 100. Thus, the lower overhead track 30 is disposed below the lower end of the overhead stocker 100. The second overhead transport vehicles 50 traveling on this lower overhead track 30 travel below the lower end of the overhead stocker 100.

The second overhead transport vehicles 50 enter the lower overhead track 30 from the inter-bay routes R1, R2 via the branch lines S1, S2, or depart from the lower overhead track 30 via the branch lines S1, S2 to the inter-bay routes R1, R2. Each second overhead transport vehicle 50 travels along the lower overhead track 30, and delivers or receives an article 2 to or from a load port LP of a processing apparatus TL. The second overhead transport vehicle 50 also delivers or receives an article 2 onto or from a first placement portion 14a, or onto or from a second placement portion 14b described later.

As illustrated in FIG. 3, the lower overhead track 30 has a second overhead track 31, a third overhead track 32, and connecting sections 33. The second overhead track 31 and the third overhead track 32 are straight and are provided in parallel along the X direction. The second overhead track 31 and the third overhead track 32 are disposed on the −Y side and the +Y side, respectively. The connecting sections 33 are disposed at both ends of the second overhead track 31 and the third overhead track 32 on the +X side and the −X side to connect the second overhead track 31 and the third overhead track 32. The lower overhead track 30 forms a circular circuit track with the second overhead track 31, the third overhead track 32, and the connecting sections 33. The second overhead transport vehicles 50 can travel in one direction (e.g., clockwise in planar view) in a circling manner along the second overhead track 31, the third overhead track 32, and the connecting sections 33.

In the lower overhead track 30, on the second overhead track 31, the traveling direction of each second overhead transport vehicle 50 is set to be a second direction D2 (−X direction). The second direction D2 is a traveling direction the orientation of which is the same as the first direction D1 that is the traveling direction of the first overhead transport vehicle 60 traveling on the first overhead track 23, the second direction D2 being parallel to the first direction D1.

On the third overhead track 32, the traveling direction of each second overhead transport vehicle 50 is set to be a third direction D3 (+X direction). The third overhead track 32 is provided parallel to the second overhead track 31. The third direction D3 is a direction opposite to the second direction D2 in the traveling direction of the second overhead transport vehicle 50, the third direction D3 being parallel to the second direction D2. The third direction D3 is a direction opposite to the first direction D1 that is a traveling direction of the first overhead transport vehicle 60 traveling on the first overhead track 23, the third direction D3 being parallel to the first direction D1. The second overhead track 31 and the third overhead track 32 may be disposed directly above the load ports LP.

The transport system SYS1 includes the first placement portion 14a and the second placement portion 14b to deliver or receive an article 2 between the first overhead transport vehicle 60 and a second overhead transport vehicle 50. The first placement portion 14a and the second placement portion 14b are supported in a manner suspended from the system ceiling SC1 or the ceiling C by a hanging fitting 6. The first placement portion 14a and the second placement portion 14b are each disposed below the first overhead track 23 on which the first overhead transport vehicle 60 travels. The first placement portion 14a and the second placement portion 14b are disposed at positions below and shifted laterally from the second overhead track 31 and the third overhead track 32, respectively.

Figure 6:
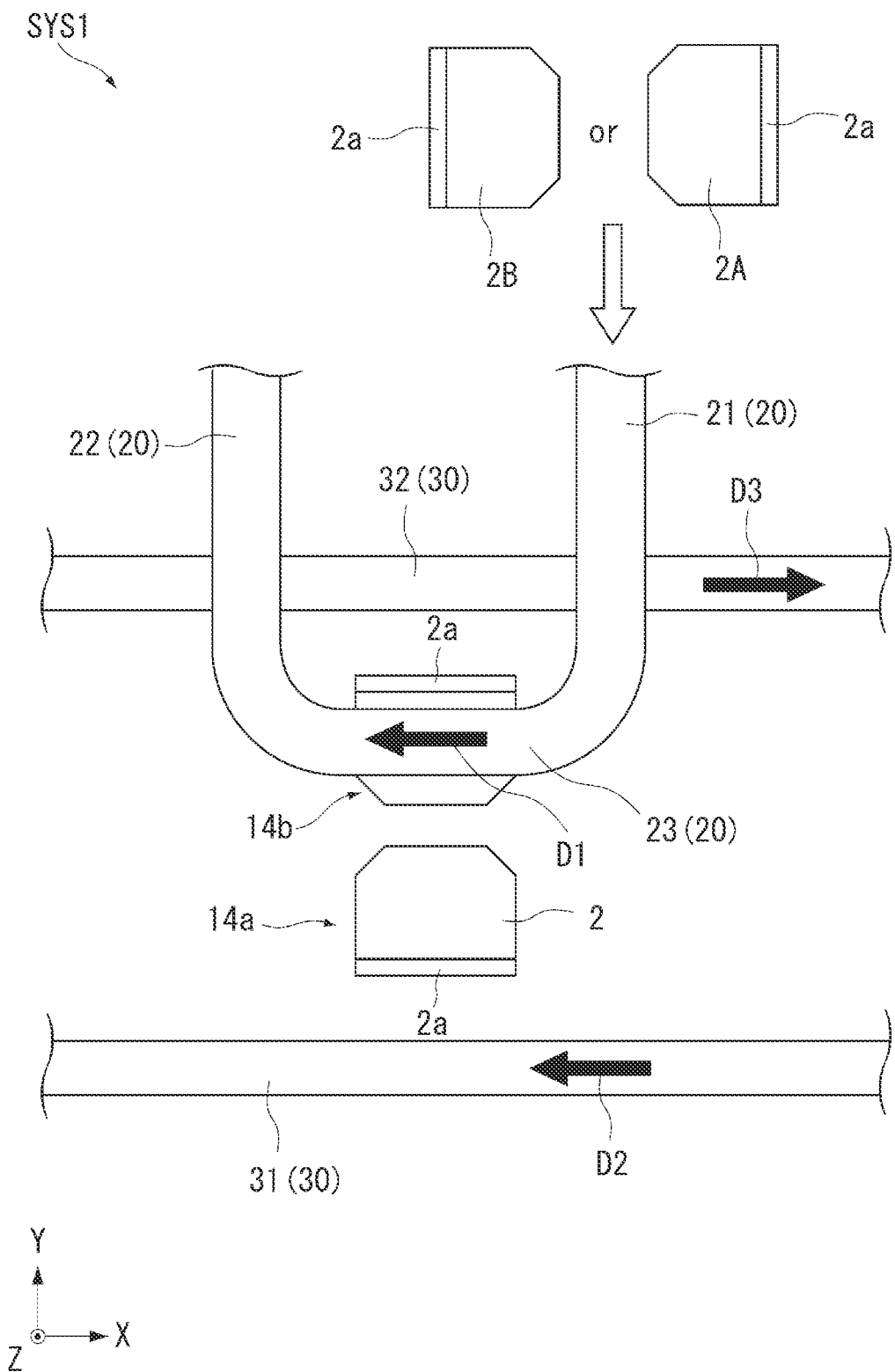
FIG. 6 is a plan view illustrating a part of the transport system illustrated in FIG. 1.

FIG. 6 is a plan view illustrating a part of the transport system SYS1. The first overhead track 23 on which the first overhead transport vehicle 60 travels is disposed directly above the second placement portion 14b. Thus, the first overhead transport vehicle 60 can deliver or receive an article 2 onto or from the second placement portion 14b by raising and lowering the first holder 63 (article 2) with the first lifting driver 64 being positioned directly above the second placement portion 14b. The first placement portion 14a is disposed at a position below and shifted laterally (in the −Y direction) from the first overhead track 23. Thus, the first overhead transport vehicle 60 can deliver or receive an article 2 onto or from the first placement portion 14a by laterally feeding the first lifting driver 64 in the −Y direction from the first overhead track 23 and raising and lowering the first holder 63 (article 2) with the first lifting driver 64 being positioned directly above the first placement portion 14a. The first overhead track 23 may be disposed directly above the first placement portion 14a instead of being disposed directly above the second placement portion 14b.

A second overhead transport vehicle 50 traveling on the second overhead track 31 can deliver or receive an article 2 onto or from the first placement portion 14a by causing the second lateral feeder 55 to laterally feed the second lifting driver 54 in the +Y direction and raising and lowering the second holder 53 (article 2) with the second lifting driver 54 being positioned directly above the first placement portion 14a. A second overhead transport vehicle 50 traveling on the third overhead track 32 can deliver or receive an article 2 onto or from the second placement portion 14b by causing the second lateral feeder 55 to laterally feed the second lifting driver 54 in the −Y direction and raising and lowering the second holder 53 (article 2) with the second lifting driver 54 being positioned directly above the second placement portion 14b. Each of the first placement portion 14a and the second placement portion 14b does not necessarily have to be single. For example, when the first overhead track 23 is long in the X direction, one or both of the first placement portion 14a and the second placement portion 14b may be provided in plurality in a manner aligned in the X direction.

Figure 7A:
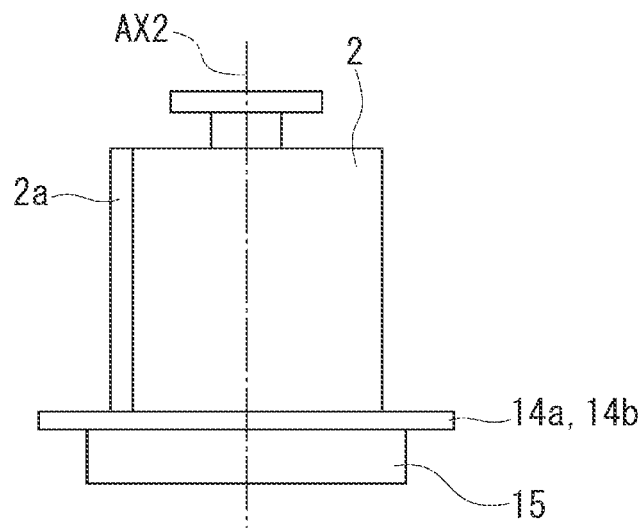
FIG. 7(A) is a side view schematically illustrating one example of a first placement portion and a second placement portion.
Figure 7B:
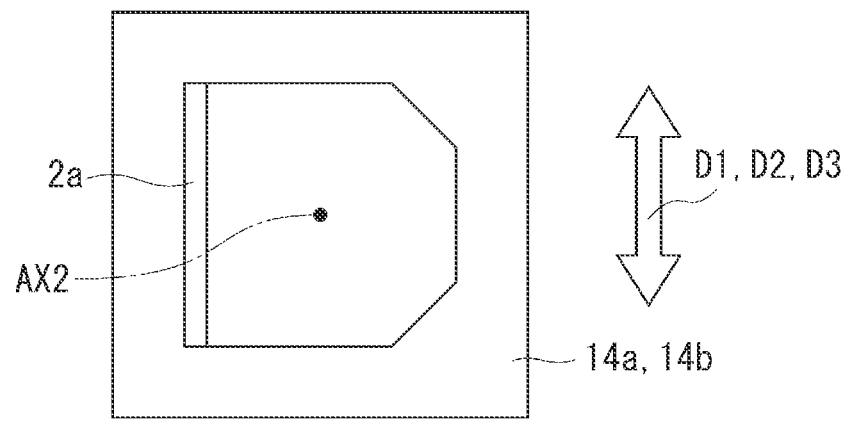
FIGS. 7(B) and 7(C) are plan views schematically illustrating one example of rotating an article on each of the first placement portion and the second placement portion.
Figure 7C:
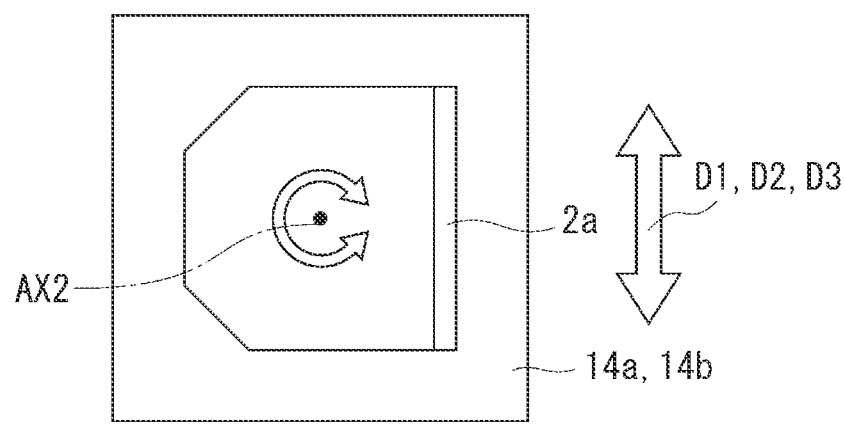

FIG. 7(A) is a side view schematically illustrating one example of the first placement portion 14a and the second placement portion 14b, and FIGS. 7(B) and 7(C) are plan views schematically illustrating one example of rotating an article 2 on each of the first placement portion 14a and the second placement portion 14b. As illustrated in FIG. 7(A), each of the first placement portion 14a and the second placement portion 14b includes a rotator 15 that rotates the article 2 placed on the corresponding one of the first placement portion 14a and the second placement portion 14b around a rotation axis AX2 that is a vertical axis. The rotator 15 includes a driving source (not illustrated) such as an electric motor, and causes this driving source (not illustrated) such as an electric motor to rotate the corresponding one of the first placement portion 14a and the second placement portion 14b. The rotator 15 drives the corresponding one of the first placement portion 14a and the second placement portion 14b under control of a controller (not illustrated), for example, thereby being able to rotate the article 2 at least 180°. As illustrated in FIGS. 7(B) and 7(C), when the rotator 15 rotates the article 2 180° around the rotation axis AX2, the orientation of the lid 2a is oppositely oriented in a direction orthogonal to the traveling direction.

The transport system SYS1 includes at least the first overhead track 23, the first overhead transport vehicle 60, the second overhead track 31, the third overhead track 32, the second overhead transport vehicles 50, the first placement portion 14a, and the second placement portion 14b described above. The transport system SYS1 does not necessarily have to include the rotators 15, 56, 66 in the first overhead transport vehicles 60, the second overhead transport vehicles 50, the first placement portions 14a, and the second placement portions 14b. For example, the transport system SYS1 only has to include a rotator (15, 56, 66) in at least one of the first overhead transport vehicles 60, the second overhead transport vehicles 50, the first placement portions 14a, and the second placement portions 14b.

In the configuration in which the rotator 66 is provided to the first overhead transport vehicle 60 out of the first overhead transport vehicle 60, the second overhead transport vehicles 50, the first placement portion 14a, and the second placement portion 14b, the number of rotators can be smaller than in the configuration in which the rotator 15 is provided to each of the first placement portion 14a and the second placement portion 14b, and thus the manufacturing cost of the transport system SYS1 can be reduced. Furthermore, in the above-described configuration in which the rotator 66 is provided to the first overhead transport vehicle 60, when the number of the second overhead transport vehicles 50 is larger than that of first overhead transport vehicles 60, the number of rotators can be smaller than in the configuration in which the rotator 56 is provided to each second overhead transport vehicle 50, and thus the manufacturing cost of the transport system SYS1 can be reduced.

When the rotator 15 is provided to at least one of the first placement portion 14a and the second placement portion 14b, the rotators 66, 56 do not have to be provided to the first overhead transport vehicle 60 or the second overhead transport vehicle 50, and thus the first overhead transport vehicle 60 or the second overhead transport vehicle 50 can be prevented from upsizing. Specifically, when an article 2 having a substantially rectangular shape in planar view is rotated to allow rotation of the article 2, the first overhead transport vehicle 60 or the second overhead transport vehicle 50 needs to be upsized (see the circles of dashed and single-dotted lines in FIG. 5). As described above, by provided the rotator 15 to the first placement portion 14a or the second placement portion 14b, the first overhead transport vehicle 60 or the second overhead transport vehicle 50 can be prevented from upsizing.

The following describes a configuration in which an article 2 is delivered to a load port LP from a storage 11 in the transport system SYS1. Articles 2 are placed in storages 11 such that, for example, their lids 2a face a side opposite to the first overhead transport vehicle 60 (see FIG. 2). The storages 11 are disposed on both sides of the upper overhead track 20. Thus, when the first overhead transport vehicle 60 has received an article 2 from a storage 11 on the left side with respect to the traveling direction, the orientation of the lid 2a of the article 2 on the first overhead transport vehicle 60 faces the left side of the traveling direction (see the article 2A in FIG. 6). When the first overhead transport vehicle 60 has received an article 2 from a storage 11 on the right side with respect to the traveling direction, the orientation of the lid 2a of the article 2 on the first overhead transport vehicle 60 faces the right side of the traveling direction (see the article 2B in FIG. 6).

While the lid 2a of an article 2 is required to be oriented in a predetermined direction in each load port LP, as for the orientation of an article 2 held by the first overhead transport vehicle 60 traveling on the first overhead track 23, the orientation of the lid 2a is either the left side or the right side of the traveling direction as illustrated in FIG. 6. In either of when a second overhead transport vehicle 50 traveling on the second overhead track 31 has received an article 2 placed on the first placement portion 14a or when a second overhead transport vehicle 50 traveling on the third overhead track 32 has received an article 2 placed on the second placement portion 14b, the orientation of the lid 2a is either of the left side or the right side of the traveling direction, and thus the orientation of the lid 2a can be assumed to be different from that required in the load port LP.

In the transport system SYS1 as described above, because at least one of the first overhead transport vehicles 60, the second overhead transport vehicles 50, the first placement portions 14a, and the second placement portions 14b includes the rotator (15, 56, 66), the article 2 can be aligned to the orientation of the lid 2a required in the load port LP by rotating the article 2 with the rotator (15, 56, 66).

Figure 8:
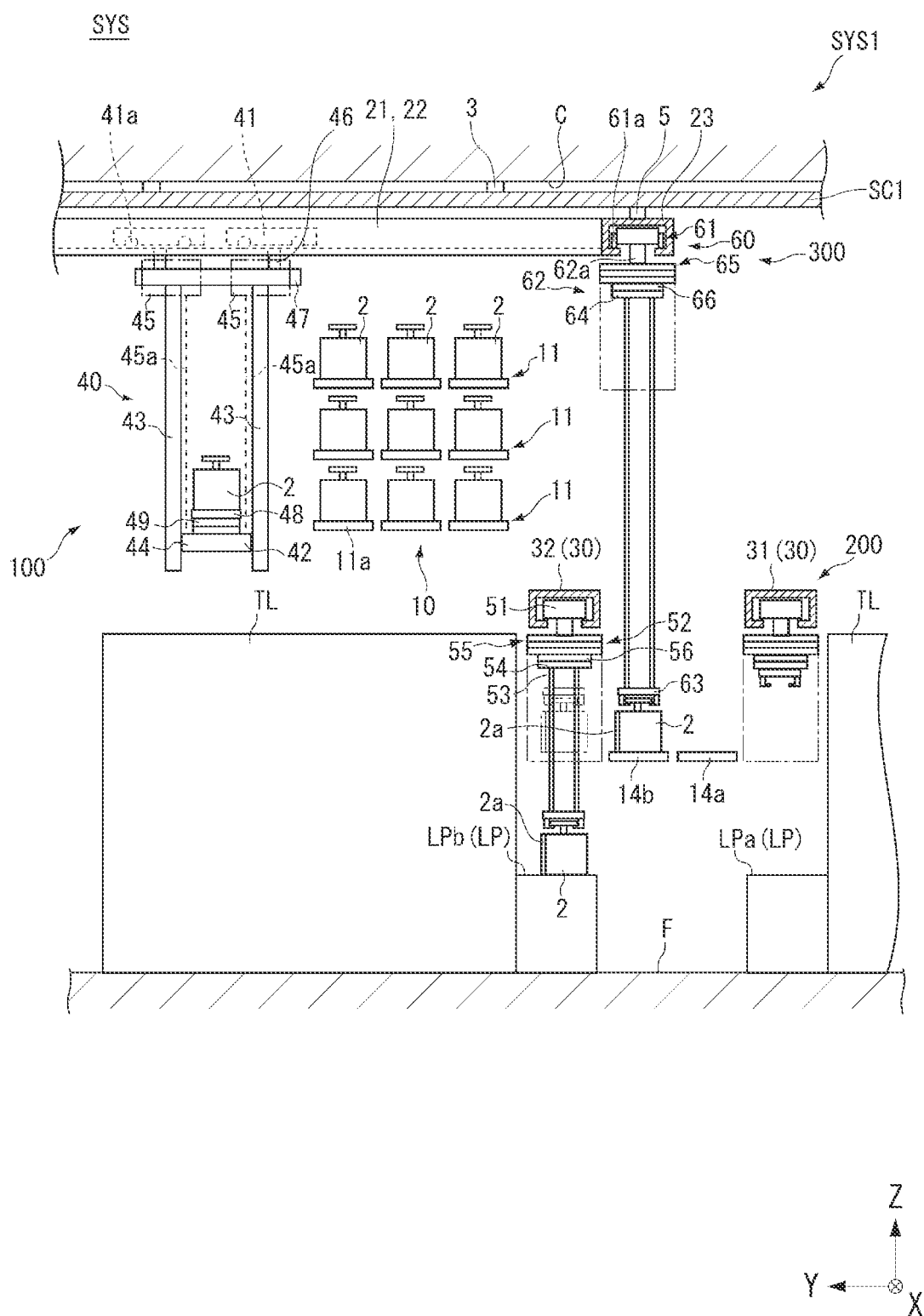
FIG. 8 is a diagram illustrating one example of operation of delivering an article onto a load port.

The following describes a configuration in which an article 2 is delivered to a load port LP from a storage 11 with reference to the drawings. In the following description, it is assumed that, if the lid 2a faces the left side with respect to the traveling direction, a second overhead transport vehicle 50 can deliver the article 2 to the load port LP without changing the current orientation thereof, and the article 2 is to be rotated by the first overhead transport vehicle 60. FIG. 8 is a diagram illustrating a case in which an article 2 in a storage 11 is delivered from the second overhead transport vehicle 50 on the third overhead track 32 to the load port LPb on the +Y side.

To begin, a controller (not illustrated) controls and instructs the first overhead transport vehicle 60 to receive an article 2 to be transported from an uppermost storage 11 and deliver the article 2 to the second placement portion 14b. If the article 2 to be transported is located in a storage 11 other than the uppermost one, the crane 40 of the overhead stocker 100 transfers the article 2 to be transported to the uppermost storage 11. The first overhead transport vehicle 60 travels along the upper overhead track 20, stops beside the storage 11 on which the article 2 to be transported is placed, causes the first lateral feeder 65 to protrude and then causes the first lifting driver 64 to lower the first holder 63, and causes the first holder 63 to grasp the article 2. Subsequently, the first overhead transport vehicle 60 causes the first lifting driver 64 to raise the first holder 63 and then causes the first lateral feeder 65 to contract to return the first holder 63 to the retracted position, thereby accommodating the article 2 in the first body 62.

Subsequently, the first overhead transport vehicle 60 travels on the first overhead track 23 (upper overhead track 20) with the first holder 63 holding the article 2, and stops directly above the second placement portion 14b. At this time, when the first overhead transport vehicle 60 had received the article 2 from a storage 11 on the left side, the lid 2a faces the left side of the traveling direction (see the article 2A in FIG. 6), and if the article 2 is placed immediately on the second placement portion 14b, the lid 2a faces the −Y side. In this state, if the second overhead transport vehicle 50 on the third overhead track 32 has received the article 2 on the second placement portion 14b, the lid 2a faces the right side of the traveling direction, which is different from the orientation required in the load port LPb.

Thus, the first overhead transport vehicle 60 drives the rotator 66 to rotate the article 2 180° around the vertical axis (see FIG. 5). Subsequently, as illustrated in FIG. 8, the first overhead transport vehicle 60 drives the first lifting driver 64 to lower the first holder 63 and the article 2, and places the article 2 on the second placement portion 14b and then releases the grasping with the first holder 63, thereby delivering the article 2 to the second placement portion 14b. When the first overhead transport vehicle 60 had received the article 2 from a storage 11 on the right side, the lid 2a faces the right side of the traveling direction (see the article 2B in FIG. 6). Thus, even if the article 2 is placed immediately on the second placement portion 14b, the lid 2a faces the +Y side, and thus the rotator 66 does not need to rotate the article 2.

Subsequently, a controller (not illustrated) controls and instructs the second overhead transport vehicle 50 to receive the article 2 from the second placement portion 14b and deliver the article 2 to the specified load port LPb on the +Y side. The second overhead transport vehicle 50 travels on the third overhead track 32, and stops on the +Y side of the second placement portion 14b on which the article 2 is placed. Subsequently, the second lateral feeder 55 laterally feeds the second lifting driver 54 in the −Y direction, and then the second holder 53 is lowered to grasp the article 2. Subsequently, the second overhead transport vehicle 50 causes the second lifting driver 54 to raise the second holder 53 and then causes the second lateral feeder 55 to contract to return the second holder 53 to the retracted position, thereby accommodating the article 2 in the second body 52. Subsequently, the second overhead transport vehicle 50 travels on the lower overhead track 30, stops above the load port LPb, causes the second lifting driver 54 to lower the second holder 53, and places the article 2 on the load port LPb. Consequently, the article 2 is placed on the load port LPb with the lid 2a facing the direction required in the load port LPb (with the lid 2a facing the +Y side).

When an article 2 is transported from the load port LPb to a storage 11, by performing a series of the above-described operations in the reverse order, the article 2 is transported from the load port LPb to the storage 11 via the second placement portion 14b.

Figure 9:
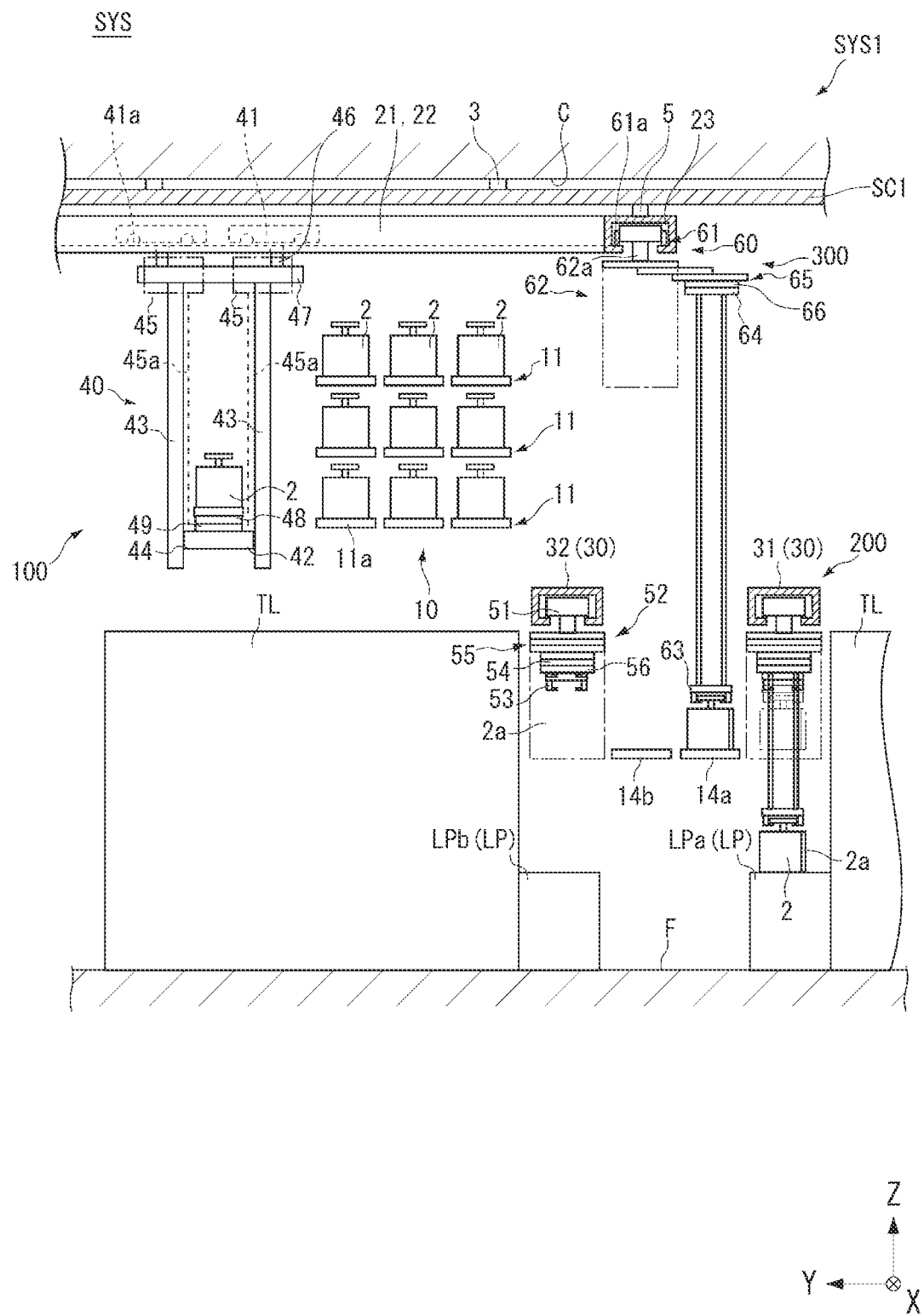
FIG. 9 is a diagram illustrating another example of the operation of delivering an article onto a load port.

FIG. 9 is a diagram illustrating a configuration in which an article 2 in a storage 11 is delivered from the second overhead transport vehicle 50 on the second overhead track 31 to the load port LPa on the −Y side. Operation of receiving the article 2 from the storage 11 by the first overhead transport vehicle 60 is the same as that described above. The first overhead transport vehicle 60 travels on the first overhead track 23 (upper overhead track 20) with the first holder 63 holding the article 2, and stops at a position above and shifted laterally from the first placement portion 14a. At this time, when the first overhead transport vehicle 60 has placed the article 2 on the first placement portion 14a with the lid 2a of the article 2 facing the right side of the traveling direction (see the article 2B in FIG. 6), the lid 2a faces the +Y side. In this state, if the second overhead transport vehicle 50 on the second overhead track 31 has received the article 2 on the first placement portion 14a, the lid 2a faces the right side of the traveling direction, which is different from the orientation required in the load port LPa.

Thus, the first overhead transport vehicle 60 drives the rotator 66 to rotate the article 2 180° around the vertical axis (see FIG. 5). Subsequently, as illustrated in FIG. 9, the first overhead transport vehicle 60 causes the first lateral feeder 65 to laterally feed the first lifting driver 64 in the −Y direction, and then drives the first lifting driver 64 to lower the first holder 63 and the article 2 and to place the article 2 on the first placement portion 14a. The first overhead transport vehicle 60 then releases the grasping with the first holder 63, thereby delivering the article 2 to the first placement portion 14a. When, in the first overhead transport vehicle 60, the lid 2a of the article 2 faces the left side of the traveling direction (see the article 2A in FIG. 6), the lid 2a faces the −Y side even if the article 2 is placed immediately on the first placement portion 14a, and thus the rotator 66 does not need to rotate the article 2.

Subsequently, the controller (not illustrated) controls and instructs the second overhead transport vehicle 50 to receive the article 2 from the first placement portion 14a and deliver the article 2 to the specified load port LPa on the −Y side. The second overhead transport vehicle 50 travels on the second overhead track 31, and stops on the −Y side of the first placement portion 14a on which the article 2 is placed. Subsequently, the second lateral feeder 55 laterally feeds the second lifting driver 54 in the +Y direction, and then the second holder 53 is lowered to grasp the article 2. Subsequently, the second overhead transport vehicle 50 causes the second lifting driver 54 to raise the second holder 53 and then causes the second lateral feeder 55 to contract to return the second holder 53 to the retracted position, thereby accommodating the article 2 in the second body 52. Subsequently, the second overhead transport vehicle 50 travels along the lower overhead track 30, stops above the load port LPa, causes the second lifting driver 54 to lower the second holder 53, and places the article 2 on the load port LPa. Consequently, the article 2 is placed on the load port LPa with the lid 2a facing the direction required in the load port LPa (with the lid 2a facing the −Y side).

When an article 2 is transported from the load port LPa to a storage 11, by performing a series of the above-described operations in the reverse order, the article 2 is transported from the load port LPa to the storage 11 via the first placement portion 14a.

As described above, with the transport system SYS1, because an article 2 can be rotated by the rotator (56, 66, 15) provided to at least one of the second overhead transport vehicles 50, the first overhead transport vehicles 60, the first placement portion 14a, and the second placement portion 14b, the front-and-rear orientation of the article 2 to be delivered or received between the first overhead transport vehicle 60 and a second overhead transport vehicle 50 can be set to an orientation required in the load port LP, and thus the efficiency of transporting articles 2 can be improved. Furthermore, because the second direction D2 in the second overhead track 31 and the third direction D3 in the third overhead track 32 are parallel to the first direction D1 in the first overhead track 23 in planar view, the front-and-rear orientation of the article 2 (orientation of the lid 2a) can be easily set to an appropriate orientation by causing the rotator (56, 66, 15) to rotate the article 2 180° around the vertical axis.

Second Example

Figure 10:
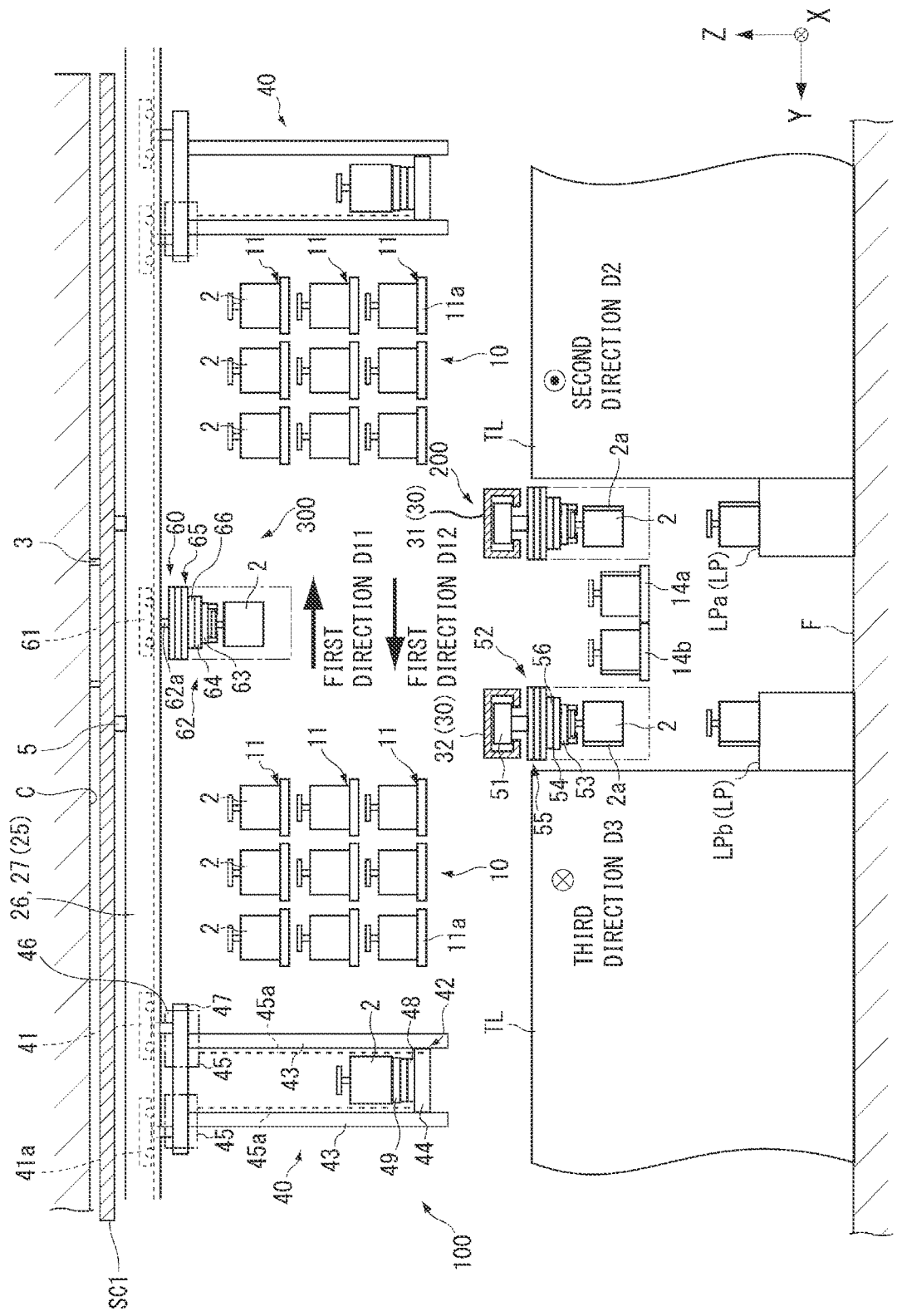
FIG. 10 is a diagram of a transport system according to a second example when viewed from the X direction.

In the above-described first example, a configuration has been described in which the first direction D1 is parallel to the second direction D2 and the third direction D3. However, my transport systems are not limited to this configuration. FIG. 10 is a diagram of a transport system SYS2 according to a second example when viewed from the X direction. FIG. 10 is a view taken along arrows B-B in FIG. 3. In the following description, components that are the same as or equivalent to those in the above-described first example are designated by the same reference signs, and description thereof is omitted or simplified.

The transport system SYS2 is included in the storing system SYS as illustrated in FIG. 3. The transport system SYS2 includes elements in an overhead stocker 100, an overhead transport vehicle system 200, and a transport device 300 as illustrated in FIG. 10. The overhead transport vehicle system 200 and the transport device 300 have the same configurations as those in the first example. The overhead stocker 100 includes racks 10, an upper overhead track 25, and cranes 40. The racks 10 are disposed, in planar view, inside and outside the upper overhead track 25 on which the cranes 40 travel (see FIG. 3).

The upper overhead track 25 is provided in a manner suspended from the system ceiling SC1 by hanging fittings 5 as illustrated in FIG. 10. The upper overhead track 25 may be suspended directly from the ceiling C instead of being suspended from the system ceiling SC1. As illustrated in FIG. 3, the upper overhead track 25 is a circular circuit track having: two straight first overhead tracks 26, 27 extending in the Y direction; and connecting sections 28 connecting between the first overhead tracks 26, 27 on the −Y side and the +Y side of the first overhead tracks 26, 27. On the first overhead track 26, the traveling direction of the first overhead transport vehicles 60 is set to be a first direction D11 (−Y direction). The upper overhead track 25 also has two branch sections 29 that are formed inside in planar view. The two branch sections 29 each connect between the first overhead tracks 26, 27 inside the upper overhead track 25. With these branch sections 29, the upper overhead track 25 includes two circuit tracks.

On the first overhead track 27, the traveling direction of the first overhead transport vehicles 60 is set to be a first direction D12 (+Y direction). The first overhead tracks 26, 27 intersect with the second overhead track 31 and the third overhead track 32 of the lower overhead track 30 in planar view as illustrated in FIG. 3.

The height of the upper overhead track 25 from the floor F is higher than the lower overhead track 30 as illustrated in FIG. 10. The above-described racks 10 are provided on the +X side and the −X side with respect to the first overhead tracks 26, 27. In other words, the racks 10 are disposed, in planar view, inside and outside the upper overhead track 25 that is a circuit track on which the cranes 40 travel. The first overhead transport vehicles 60 that are transport devices 300 travel on the upper overhead track 25.

The transport system SYS2 includes a first placement portion 14*a* and a second placement portion 14*b* to deliver or receive an article 2 between a first overhead transport vehicle 60 and a second overhead transport vehicle 50. The first placement portion 14*a* and the second placement portion 14*b* are each provided at six locations in a manner aligned in the X direction as illustrated in FIG. 3. By disposing each of the first placement portion 14*a* and the second placement portion 14*b* at six locations, articles 2 can be efficiently delivered and received between the first overhead transport vehicles 60 and the second overhead transport vehicles 50. The first placement portion 14*a* and the second placement portion 14*b* at three locations on the +X side among the six locations correspond to the first overhead track 26. The first placement portion 14*a* and the second placement portion 14*b* at three locations on the −X side correspond to the first overhead track 27.

Figure 11:
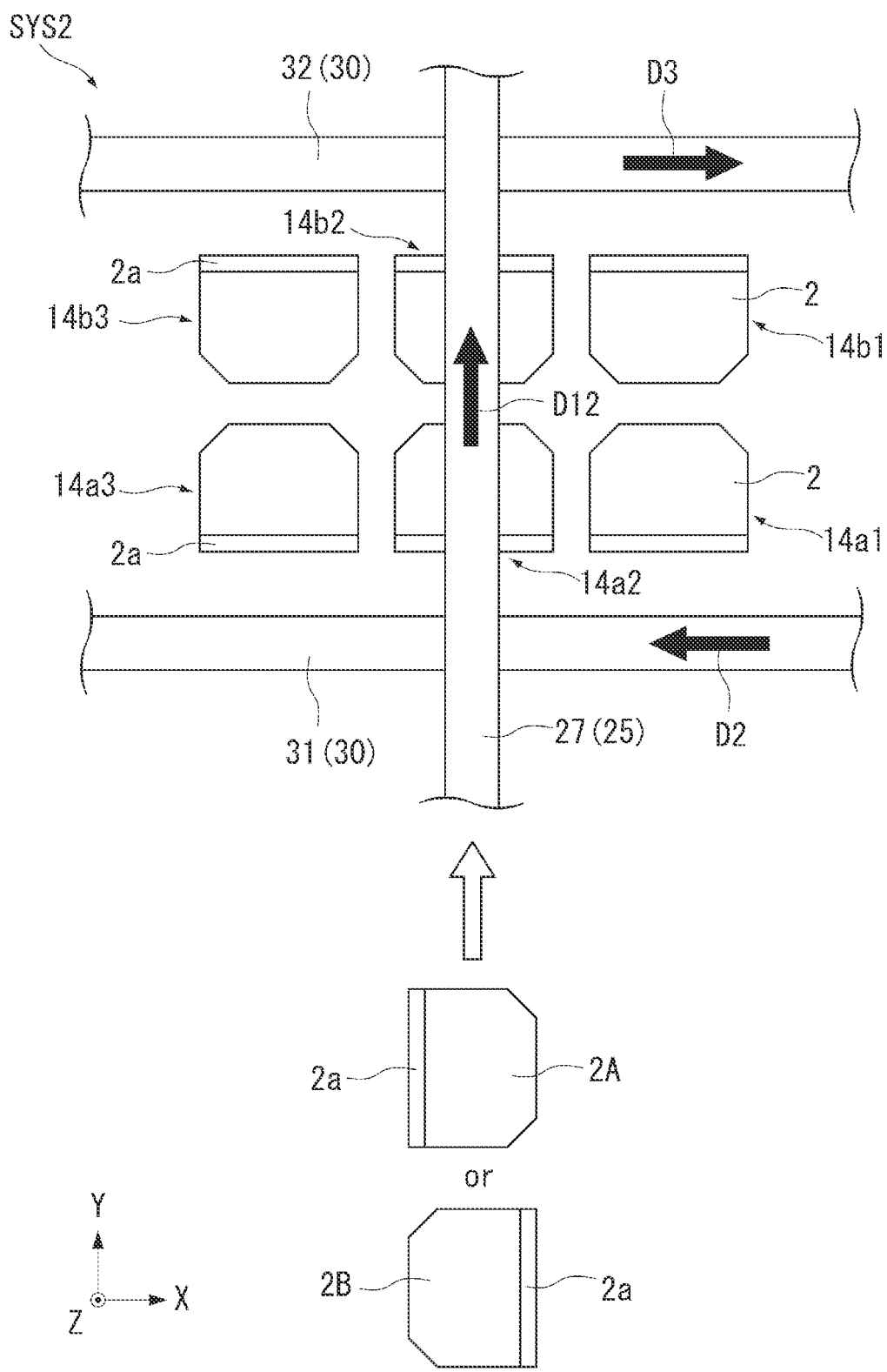
FIG. 11 is a plan view illustrating a part of the transport system illustrated in FIG. 10.

FIG. 11 is a plan view illustrating a part of the transport system SYS2. In FIG. 11, the first overhead track 27 is illustrated. As illustrated in FIG. 11, corresponding to the first overhead track 27, first placement portions 14*a*1, 14*a*2, 14*a*3 are disposed in the order from the +X side, and second placement portions 14*b*1, 14*b*2, 14*b*3 are disposed in the order from the +X side in the same manner. The first overhead track 27 on which the first overhead transport vehicles 60 travel is disposed directly above the first placement portion 14*a*2 and the second placement portion 14*b*2. Also, in the first overhead track 26, the first placement portions 14*a*1, 14*a*2, 14*a*3, and the second placement portions 14*b*1, 14*b*2, 14*b*3 are disposed in the same manner as described above.

Figure 12:
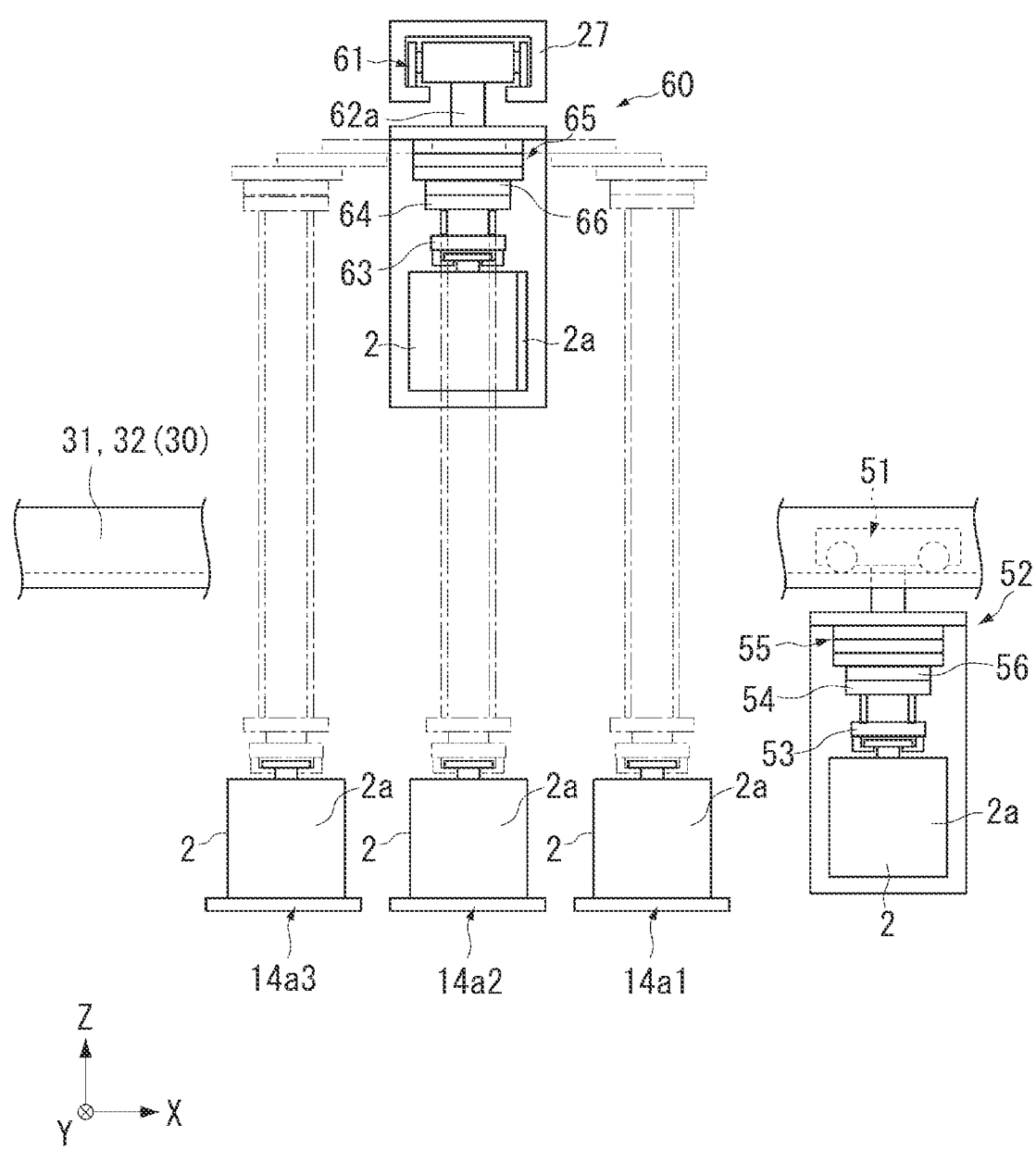
FIG. 12 is a diagram of a part of the transport system illustrated in FIG. 10 when viewed from the Y direction.

FIG. 12 is a diagram of the transport system SYS2 when viewed from the Y direction. As illustrated in FIG. 12, the first overhead transport vehicle 60 can deliver or receive an article 2 onto or from the first placement portion 14*a*2 by raising and lowering the first holder 63 (article 2) with the first lifting driver 64 being positioned directly above the first placement portion 14*a*2. The first placement portion 14*a*1 is disposed at a position below and shifted laterally (in the +X direction) from the first overhead track 27. Thus, the first overhead transport vehicle 60 can deliver or receive an article 2 onto or from the first placement portion 14*a*1 by laterally feeding the first lifting driver 64 in the +X direction from the first overhead track 27 and raising and lowering the first holder 63 (article 2) with the first lifting driver 64 being positioned directly above the first placement portion 14*a*1. The first placement portion 14*a*3 is disposed at a position below and shifted laterally (in the −X direction) from the first overhead track 27. Thus, the first overhead transport vehicle 60 can deliver or receive an article 2 onto or from the first placement portion 14*a*3 by laterally feeding the first lifting driver 64 in the −X direction from the first overhead track 27 and raising and lowering the first holder 63 (article 2) with the first lifting driver 64 being positioned directly above the first placement portion 14*a*3. The first overhead transport vehicle 60 can deliver or receive an article 2 onto or from the second placement portions 14*b*1, 14*b*2, 14*b*3 in the same manner as described above.

A second overhead transport vehicle 50 traveling on the second overhead track 31 can deliver or receive an article 2 onto or from the first placement portions 14*a*1, 14*a*2, 14*a*3 by causing the second lateral feeder 55 to laterally feed the second lifting driver 54 in the +Y direction and raising and lowering the second holder 53 (article 2) with the second lifting driver 54 being positioned directly above any one of the first placement portions 14*a*1, 14*a*2, 14*a*3. A second overhead transport vehicle 50 traveling on the third overhead track 32 can deliver or receive an article 2 onto or from the second placement portions 14*b*1, 14*b*2, 14*b*3 by causing the second lateral feeder 55 to laterally feed the second lifting driver 54 in the −Y direction and raising and lowering the second holder 53 (article 2) with the second lifting driver 54 being positioned directly above any one of the second placement portions 14*b*1, 14*b*2, 14*b*3.

Figure 13A:
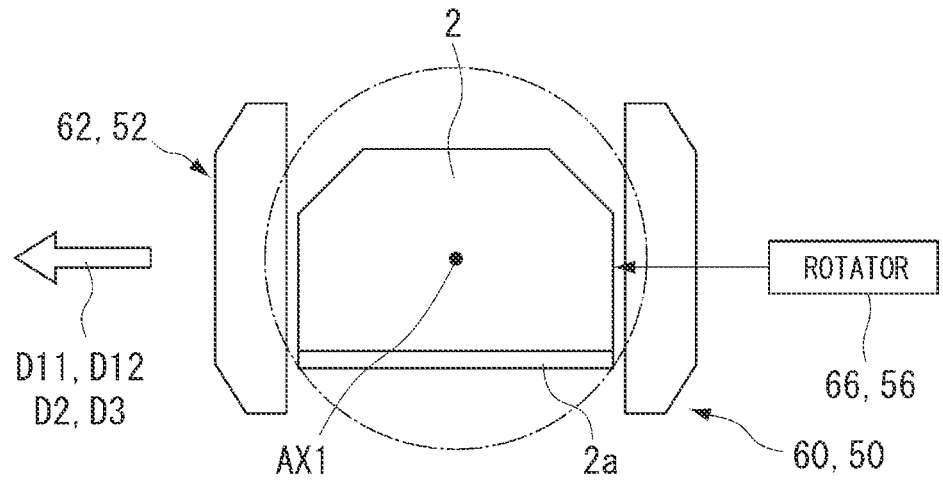
FIGS. 13(A) to 13(C) are plan views illustrating one example of rotating an article in a first overhead transport vehicle or a second overhead transport vehicle.
Figure 13B:
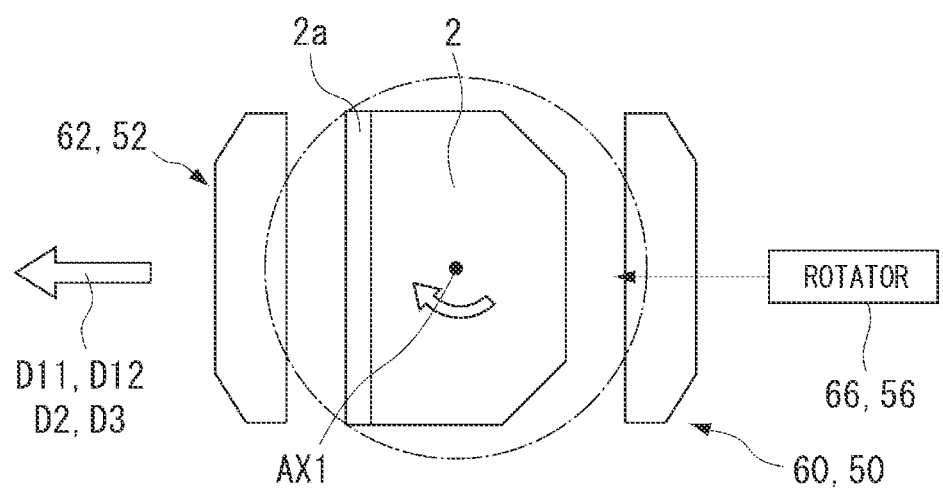
Figure 13C:
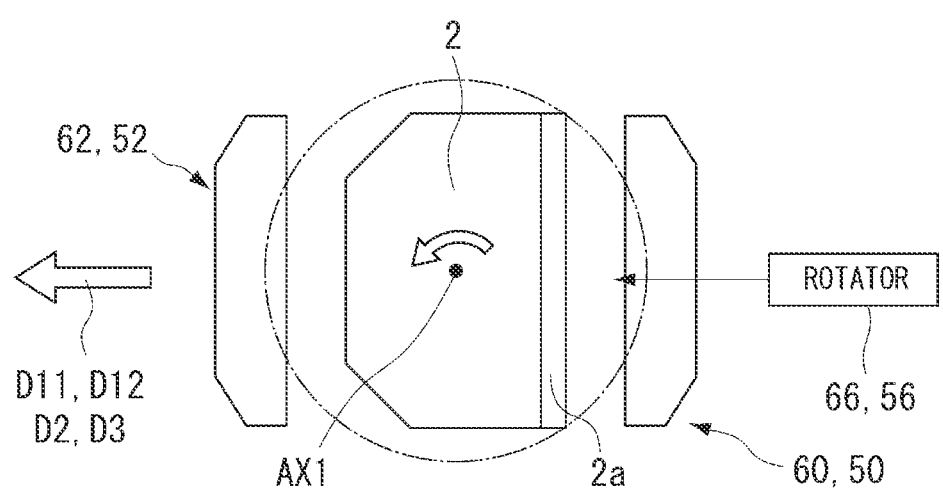

FIGS. 13(A) to 13(C) are plan views illustrating one example of rotating an article 2 in a first overhead transport vehicle 60 or a second overhead transport vehicle 50. In the transport system SYS2, the first overhead transport vehicle 60 or the second overhead transport vehicle 50 can cause the rotator 66 or 56 to rotate the first lifting driver 64 or the second lifting driver 54 clockwise or counterclockwise 90° around the rotation axis AX1 that is a vertical axis. In other words, the rotator 66 or 56 can rotate the first lifting driver 64 or the second lifting driver 54 within a range of 180°.

As illustrated in FIG. 13(A), for example, the first overhead transport vehicle 60 transports the article 2 with the lid 2*a* facing the left side or the right side with respect to the traveling direction (in this illustration, with the lid 2*a* facing the left side). From this state, causing the rotator 66 to rotate the article 2 clockwise 90° around the vertical axis as illustrated in FIG. 13(B) enables the lid 2*a* of the article 2 to face forward in the traveling direction. Thus, when the first overhead transport vehicle 60 travels on the first overhead track 27 and places an article 2 on the second placement portions 14*b*1, 14*b*2, 14*b*3, the article 2 can be placed with the lid 2*a* facing the +Y side as illustrated in FIG. 11. As illustrated in FIG. 13(C), causing the rotator 66 to rotate the article 2 counterclockwise 90° around the vertical axis enables the lid 2*a* of the article 2 to face backward in the traveling direction. Thus, when the first overhead transport vehicle 60 travels on the first overhead track 27 and places an article 2 on the first placement portions 14*a*1, 14*a*2, 14*a*3, the article 2 can be placed with the lid 2*a* facing the −Y side as illustrated in FIG. 11.

Figure 14A:
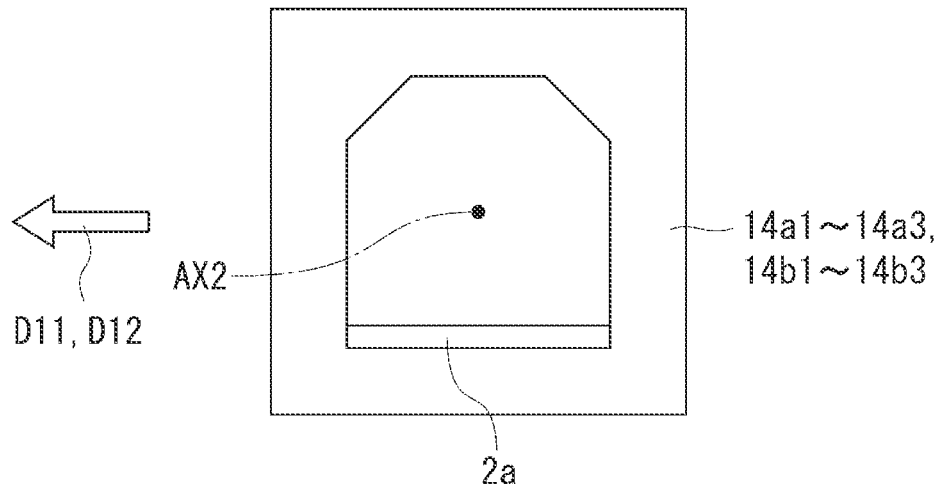
FIGS. 14(A) to 14(C) are plan views schematically illustrating one example of rotating an article on each of a first placement portion and a second placement portion.
Figure 14B:
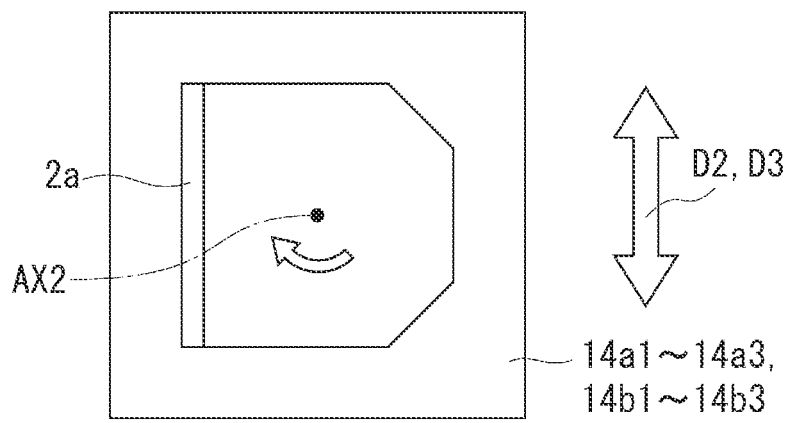
Figure 14C:
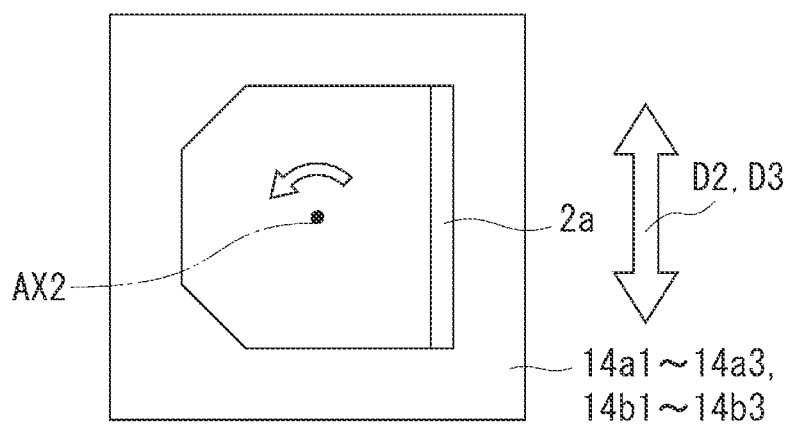

FIGS. 14(A) to 14(C) are plan views schematically illustrating one example of rotating an article 2 on the first placement portions 14*a*1, 14*a*2, 14*a*3 and the second placement portions 14*b*1, 14*b*2, 14*b*3. As illustrated in FIG. 14(A), for example, if the first overhead transport vehicle 60 had transported the article 2 with the lid 2*a* facing the left side with respect to the traveling direction and had placed the article 2 in this state on the first placement portion 14*a*1 or the second placement portion 14*b*1 or the like, the orientation of the lid 2*a* faces forward or backward with respect to the traveling direction when the second overhead transport vehicle 50 has received the article 2 with no operation performed thereon. Thus, as illustrated in FIGS. 14(B) and 14(C), the first placement portion 14*a*1 and the second placement portion 14*b*1, for example, each cause the rotator 15 (see FIG. 7) to rotate the article 2 placed on the first placement portion 14*a*1 or the second placement portion 14*b*1 or the like clockwise or counterclockwise 90° around the rotation axis AX2 that is a vertical axis that enables the lid 2*a* of the article 2 to face the left side or the right side with respect to the traveling direction of the second overhead transport vehicle 50.

The transport system SYS2 includes at least the first overhead tracks 26, 27, the first overhead transport vehicles 60, the second overhead track 31, the third overhead track 32, the second overhead transport vehicles 50, the first placement portions 14*a*1, 14*a*2, 14*a*3, and the second placement portions 14*b*1, 14*b*2, 14*b*3 described above. The transport system SYS2 does not necessarily have to include the rotators 15, 56, 66 in the first overhead transport vehicles 60, the second overhead transport vehicles 50, the first placement portions 14a1, 14a2, 14a3, and the second placement portions 14b1, 14b2, 14b3. For example, the transport system SYS2 only has to include a rotator (15, 56, 66) in at least one of the first overhead transport vehicles 60, the second overhead transport vehicles 50, the first placement portions 14a1, 14a2, 14a3, and the second placement portions 14b1, 14b2, 14b3.

The following describes a configuration in which an article 2 is delivered to a load port LP from a storage 11 in the transport system SYS2. Descriptions similar to that in the above example are omitted or simplified. When a first overhead transport vehicle 60 has received an article 2 from a storage 11, a situation in which the orientation of the lid 2a of the article 2 faces the left side of the traveling direction (see the article 2A in FIG. 11) and a situation in which the orientation of the lid 2a faces the right side of the traveling direction (see article 2B in FIG. 11) occur in the first overhead transport vehicle 60. In the transport system SYS2 as described above, the article 2 can be aligned to the orientation of the lid 2a required in the load port LP by rotating the article 2 with the rotator (15, 56, 66) included in at least one of the first overhead transport vehicles 60, the second overhead transport vehicles 50, the first placement portions 14a1, 14a2, 14a3, and the second placement portions 14b1, 14b2, 14b3.

A configuration in which an article 2 is delivered to a load port LP from a storage 11 will be described. In the following description, it is assumed that the article 2 is to be rotated by a first overhead transport vehicle 60. To begin with, the first overhead transport vehicle 60 travels along the upper overhead track 25, and receives an article 2 from a storage 11. Subsequently, the first overhead transport vehicle 60 travels on the first overhead track 26 or the first overhead track 27 while holding the article 2, and stops directly above the first placement portion 14a2 or the second placement portion 14b2 (see FIG. 11). The first overhead transport vehicle 60 causes the rotator 66 to rotate the article 2 such that the lid 2a faces the −Y side when placing the article 2 on the first placement portions 14a1, 14a2, 14a3, or such that the lid 2a faces the +Y side when placing the article 2 on the second placement portions 14b1, 14b2, 14b3.

Subsequently, the first overhead transport vehicle 60 laterally feeds the first lifting driver 64 or does not laterally feed it, and lowers the article 2, thereby placing the article 2 on any one of the first placement portions 14a1, 14a2, 14a3 or the second placement portions 14b1, 14b2, 14b3 (see FIG. 12). Subsequently, a second overhead transport vehicle 50 travels on the second overhead track 31 or the third overhead track 32, stops at a position corresponding to any one of the first placement portions 14a1, 14a2, 14a3 or the second placement portions 14b1, 14b2, 14b3, and receives the article 2 with the second lifting driver 54 being laterally fed in the +Y direction or the −Y direction by the second lateral feeder 55. The second overhead transport vehicle 50 holding the article 2 travels on the upper overhead track 25, stops directly above the specified load port LP, causes the second lifting driver 54 to lower the second holder 53 (article 2) to place the article 2 on the load port LP. At this time, the lid 2a of the article 2 faces as required in the load port LP.

When an article 2 is transported from the load port LP to a storage 11, by performing a series of the above-described operations in the reverse order, the article 2 is transported from the load port LP to the storage 11 via any one of the first placement portions 14a1, 14a2, 14a3 and the second placement portions 14b1, 14b2, 14b3.

As described above, with the transport system SYS2, because an article 2 can be rotated by the rotator (56, 66, 15) provided to at least one of the second overhead transport vehicles 50, the first overhead transport vehicles 60, the first placement portions 14a1, 14a2, 14a3, and the second placement portions 14b1, 14b2, 14b3, the front-and-rear orientation of the article 2 to be delivered or received between a first overhead transport vehicle 60 and a second overhead transport vehicle 50 can be set to an orientation required in the load port LP, and thus the efficiency of transporting articles 2 can be improved. Furthermore, because the second direction D2 in the second overhead track 31 and the third direction D3 in the third overhead track 32 are orthogonal to the first directions D11, D12 in the first overhead tracks 26, 27 in planar view, the front-and-rear orientation of the article 2 (orientation of the lid 2a) can be easily set to an appropriate orientation by causing the rotator (56, 66, 15) to rotate the article 2 clockwise or counterclockwise 90° around the vertical axis.

Although the examples have been described above, my transport systems are not limited to the above description, and may be various modifications made within the scope not departing from the gist of this disclosure. For example, in the above-described examples, an example of a configuration has been described in which, in the transport systems SYS1, SYS2, the upper overhead tracks 20, 25 (first overhead tracks 23, 26, 27) and the lower overhead track 30 (the second overhead track 31, the third overhead track 32) are not connected. However, this disclosure is not limited to this configuration. For example, the upper overhead tracks 20, 25 and the lower overhead track 30 may be connected by a connecting track, for example.

In the above-described examples, an example of a configuration has been described in which, in the transport systems SYS1, SYS2, the upper overhead tracks 20, 25 (first overhead tracks 23, 26, 27), and the lower overhead track 30 (the second overhead track 31, the third overhead track 32) are suspended from the ceiling C or the system ceilings SC1, SC2. However, this disclosure is not limited to this configuration. For example, a configuration may be used in which at least one of the upper overhead tracks 20, 25 and the lower overhead track 30 may be supported by pillars, frames, or abutments, for example, provided on the floor F, and the load thereof may be received by the floor F.

One or more requirements described in the above examples, for example, may be omitted. Requirements described in the above examples, for example, may be combined appropriately. Japanese Patent Application No. 2019-011282 that is a Japanese patent application and all literature cited in the above-described examples, for example, may be used as a part of the description herein.

The invention claimed is:

1. A transport system that transports an article, the article having a defined a front-and-rear orientation, the transport system comprising:
   a first overhead track a traveling direction of which is set to be a first direction;
   a first overhead transport vehicle including a first traveler that travels along the first overhead track, a first holder that holds the article, and a first lifting driver that raises and lowers the first holder;
   a second overhead track a traveling direction of which is set to be a second direction;

a third overhead track that is provided parallel to the second overhead track and a traveling direction of which is set to be a third direction opposite to the second direction;

a second overhead transport vehicle including a second traveler that travels on the second overhead track and the third overhead track, a second holder that holds the article, a second lifting driver that raises and lowers the second holder, and a second lateral feeder that laterally moves the second lifting driver;

a first placement portion onto which or from which the second overhead transport vehicle on the second overhead track delivers or receives the article;

a second placement portion onto which or from which the second overhead transport vehicle on the third overhead track delivers or receives the article, a rack including a plurality of storages arranged vertically; and a crane that travels along a track including the first overhead track and delivers and receives the article between the storages, wherein the first overhead transport vehicle is able to deliver or receive the article onto or from the first placement portion with the first lifting driver positioned directly above the first placement portion, and is able to deliver or receive the article onto or from the second placement portion with the first lifting driver positioned directly above the second placement portion, at least one of the first overhead transport vehicle, the second overhead transport vehicle, the first placement portion, and the second placement portion is provided with a rotator that rotates the article around a vertical axis, the first overhead transport vehicle includes a first lateral feeder that laterally moves the first lifting driver, and is able to deliver or receive the article to or from each storage with the first lifting driver being laterally fed directly above the storage by the first lateral feeder, and the second overhead track and the third overhead track are provided below lower ends of the crane and the rack.

2. The transport system according to claim 1, wherein at least one of the first placement portion and the second placement portion is provided in plurality.

3. The transport system according to claim 1, wherein the rotator is provided to the first overhead transport vehicle, and rotates the article held by the first holder around a vertical axis.

4. The transport system according to claim 1, wherein the rotator is provided to at least one of the first placement portion and the second placement portion, and rotates a placed article around a vertical axis.

5. The transport system according to claim 1, wherein
the first direction is a direction that is the same as the second direction in planar view, and
the rotator rotates the article 180° around the vertical axis.

6. The transport system according to claim 1, wherein
the first direction is a direction that is orthogonal to the second direction in planar view, and
the rotator rotates the article 90° around the vertical axis.

* * * * *